United States Patent
Rostalski et al.

(10) Patent No.: US 7,190,527 B2
(45) Date of Patent: Mar. 13, 2007

(54) REFRACTIVE PROJECTION OBJECTIVE

(75) Inventors: Hans-Juergen Rostalski, Berlin (DE); Karl-Heinz Schuster, Koenigsbronn (DE); Russell Hudyma, San Ramon, CA (US); Wilhelm Ulrich, Aalen (DE); Rolf Freimann, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/931,051

(22) Filed: Sep. 1, 2004

(65) Prior Publication Data

US 2005/0231813 A1  Oct. 20, 2005

Related U.S. Application Data

(63) Continuation-in-part of application No. PCT/US03/06592, filed on Mar. 3, 2003.

(60) Provisional application No. 60/360,845, filed on Mar. 1, 2002.

(51) Int. Cl.
*G02B 9/00* (2006.01)
*G03B 27/54* (2006.01)

(52) U.S. Cl. .................... 359/649; 359/754; 355/67

(58) Field of Classification Search ........ 359/649–651, 359/754; 355/67
See application file for complete search history.

(56) References Cited

U.S. PATENT DOCUMENTS

| | | | |
|---|---|---|---|
| 5,636,066 A | 6/1997 | Takahashi | |
| 6,097,537 A | 8/2000 | Takahashi et al. | |
| 6,198,576 B1 | 3/2001 | Matsuyama | |
| 6,349,005 B1 | 2/2002 | Schuster et al. | |
| 6,538,821 B2 | 3/2003 | Takahashi | |
| 6,556,353 B2 | 4/2003 | Omura | |
| 6,560,031 B1 | 5/2003 | Shafer et al. | |
| 6,606,144 B1 * | 8/2003 | Omura | 355/67 |
| 6,700,645 B1 | 3/2004 | Shigematsu | |
| 6,791,761 B2 | 9/2004 | Shafer et al. | |

(Continued)

FOREIGN PATENT DOCUMENTS

DE  198 18 444 A1  10/1998

(Continued)

OTHER PUBLICATIONS

M. Switkes and M. Rothchild, Immersion lithography at 157 nm. J. Vac. Sci. Technol. B. Nov./Dec. 2001, pp. 2353-2356, vol. 19, No. 6.

(Continued)

*Primary Examiner*—Ricky L. Mack
*Assistant Examiner*—William Choi
(74) *Attorney, Agent, or Firm*—Sughrue Mion, PLLC

(57) ABSTRACT

Refractive projection objective with a numerical aperture greater than 0.7, consisting of a first convexity, a second convexity, and a waist arranged between the two convexities. The first convexity has a maximum diameter denoted by D1, and the second convexity has a maximum diameter denoted by D2, and $0.8 < D_1/D_2 < 1.1$.

57 Claims, 13 Drawing Sheets

156.25 MM

U.S. PATENT DOCUMENTS

| | | |
|---|---|---|
| 2001/0050820 A1 | 12/2001 | Shafer et al. |
| 2002/0001141 A1 | 1/2002 | Shafer et al. |
| 2002/0005938 A1 | 1/2002 | Omura |
| 2002/0197946 A1 | 12/2002 | Emami et al. |
| 2004/0004757 A1 | 1/2004 | Schuster |
| 2004/0120051 A1 | 6/2004 | Schuster et al. |
| 2004/0201899 A1 | 10/2004 | Shafer et al. |

FOREIGN PATENT DOCUMENTS

| | | |
|---|---|---|
| DE | 198 55 108 A1 | 5/2000 |
| DE | 102 10 899 A1 | 9/2003 |
| DE | 102 24 361 A1 | 11/2003 |
| EP | 0 816 892 A2 | 1/1998 |
| EP | 1 006 387 A2 | 6/2000 |
| EP | 1 061 396 A2 | 12/2000 |
| EP | 1 111 425 A2 | 6/2001 |
| EP | 1 139 138 A1 | 10/2001 |
| EP | 1 191 378 A1 | 3/2002 |
| JP | 103 25 922 A | 12/1998 |
| WO | 0 770 895 A2 | 5/1997 |
| WO | WO 01/04682 A1 | 1/2001 |
| WO | WO 01/23933 A1 | 4/2001 |
| WO | WO 01/23935 A1 | 4/2001 |
| WO | WO 01/50171 A1 | 7/2001 |
| WO | WO 02/082159 A1 | 10/2002 |
| WO | WO 02/103431 A1 | 12/2002 |
| WO | WO 03/036361 A1 | 5/2003 |
| WO | WO 03/052462 A2 | 6/2003 |
| WO | WO 03/075097 | 9/2003 |
| WO | WO 03/077036 A1 | 9/2003 |
| WO | WO 03/077037 A1 | 9/2003 |
| WO | WO 03/093904 | 11/2003 |
| WO | WO 2004/019128 A3 | 3/2004 |

OTHER PUBLICATIONS

John H. Bruning, Optical Lithography—Thirty years and three orders of magnitude, SPIE, pp. 14-27, vol. 3049.

Jere D. Buckley and Charles Karatzas, Step and scan: A systems overview of a new lithography tool, SPIE—Optical/Laser Microlithography II, 1989, pp. 424-433, vol. 1088.

Bruce W. Smith, Optics for Photolithography—Optical System Design, Microlithography: Science and Technology, 1998, pp. 263-264.

Walter Wöltche, Optical systems design with reference to the evolution of the double Gauss lens, SPIE-International Lens Design Conference (OSA), 1980, pp. 202-215, vol. 237.

Erhard Glatzel, New Lenses for Microlithography, Zeiss-Inform., 1981/1982, pp. 8-13, vol. 26, No. 92 E, Oberkochen, Germany.

Erhard Glatzel, New Developments in Photographic Objectives, pp. 407-428.

* cited by examiner

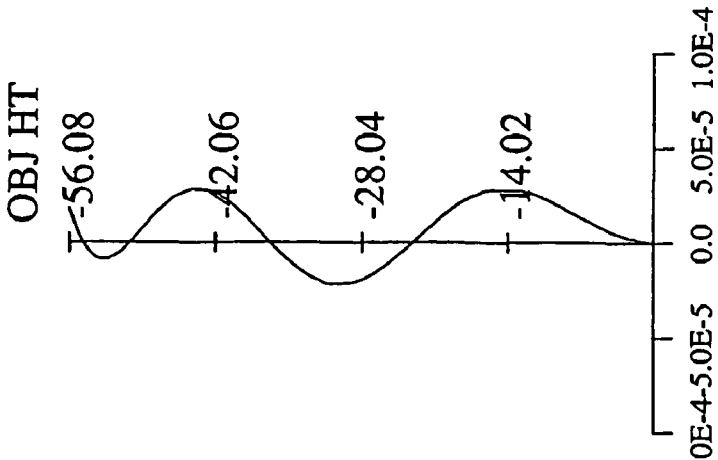
FIG.2a LONGITUDINAL SPHERICAL ABER.
FIG.2b ASTIGMATIC FIELD CURVES
FIG.2c DISTORTION

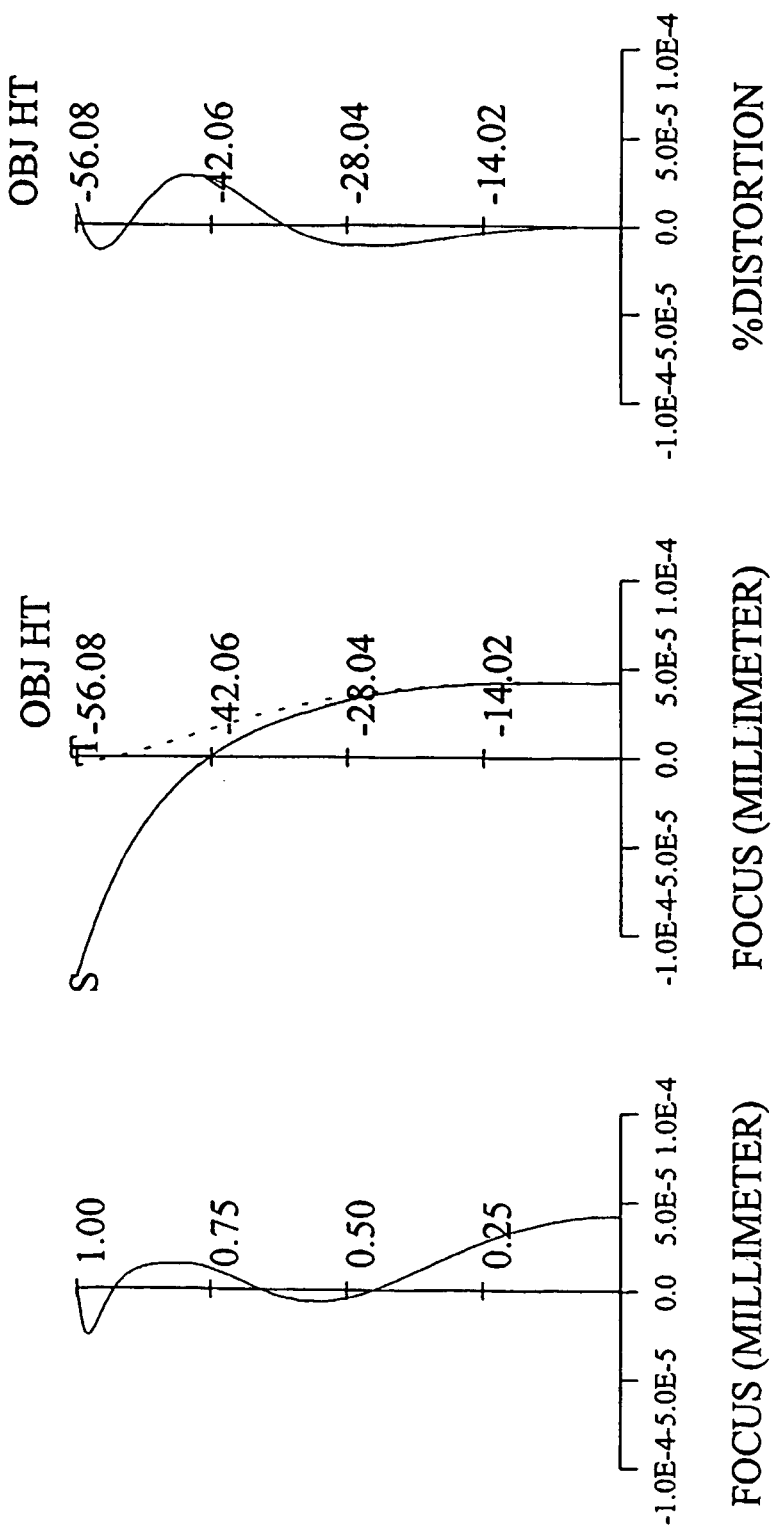

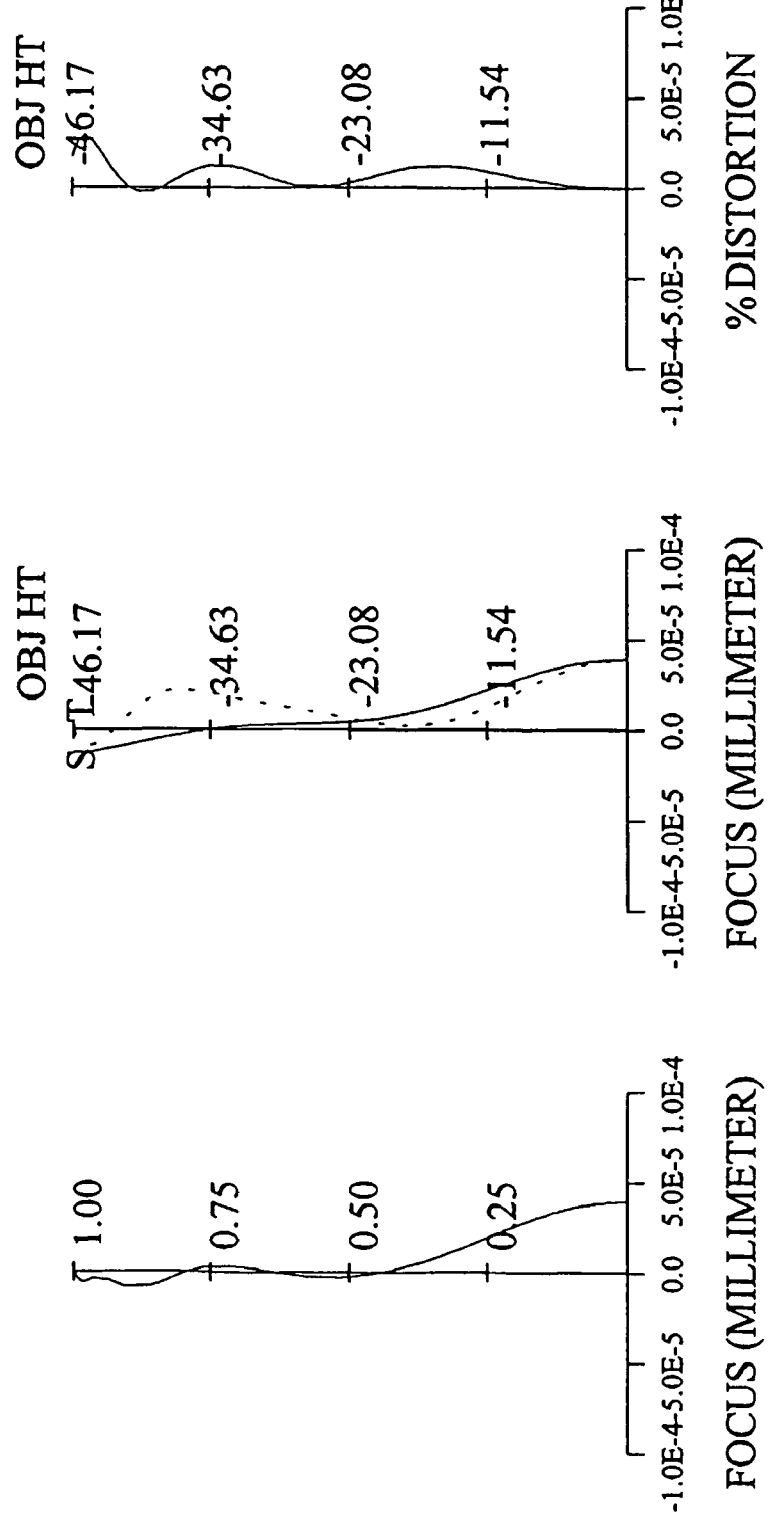

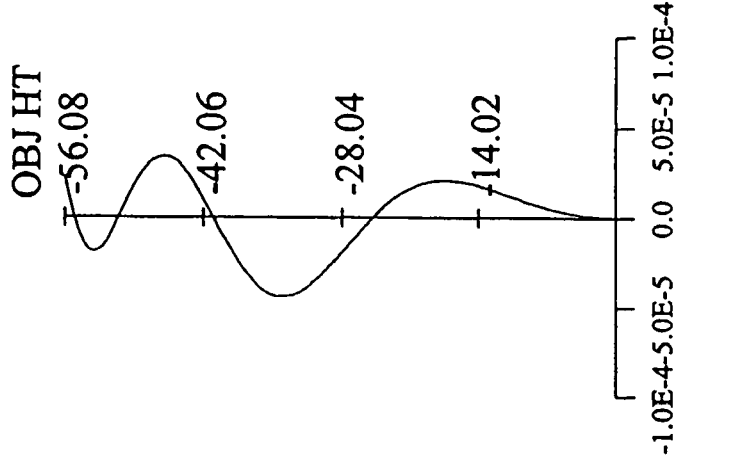
FIG.7a LONGITUDINAL SPHERICAL ABER.
FIG.7b ASTIGMATIC FIELD CURVES
FIG.7c DISTORTION

REFRACTIVE PROJECTION OBJECTIVE

This application is a continuation-in-part application of international patent application PCT/US03/06592, filed on Mar. 3, 2003 and claiming priority of U.S. provisional application 60/360,845 filed on Mar. 1, 2002, which international application was published in English as WO 03/075049 A2 on Sep. 12, 2003. The complete disclosure of the international patent application is incorporated into this application by reference. Benefit is claimed from provisional application US 60/360,845 filed on Mar. 1, 2002. International patent application PCT/US03/06592 is based on international patent application PCT/EP03/01147 filed on Feb. 6, 2003, claiming priority of U.S. Pat. No. 60/360,845 filed on Mar. 1, 2002 and published in German as WO 03/075096 A2 on Sep. 12, 2003. The complete disclosure of this latter international patent application is also incorporated into this application by reference.

BACKGROUND OF THE INVENTION

1. Field of the Invention

The invention relates to a refractive projection objective for microlithography, which consists, in the direction of light propagation, of a first convexity, a waist, and a second convexity. Such refractive projection objectives are also termed "single-waist" systems 2. Description of the Related Art Such single-waist systems are known, for example, from U.S. Pat. No. 60/160799, EP 1 061 396 A2, and from EP 1 139 138 A1 or WO 01/23933–WO 01/23935. It is already known from these documents that the first or the first two object-side lenses have negative refractive power. Furthermore it is known from these documents that the imaging quality can be increased by the use of aspherics. Since the resolution attainable with a projection objective increases in proportion to the image-side numerical aperture of the projection objective, and furthermore in proportion to the reciprocal of the exposure wavelength, the endeavor is predominantly to provide projection objectives with the greatest possible numerical aperture in order to increase the resolution.

U.S. Pat. No. 6,560,031 shows another refractive projection objective having one waist and a first, object-side lens having negative refractive power, wherein at least one lens which is arranged between the object plane and the waist comprises an aspherical surface.

International patent application PCT/E 02/04846 filed on May 3, 2002 by the applicant and claiming priority of DE 102 10 899.4 filed on Mar. 8, 2002 shows other single-waist systems allowing very high image-side numerical apertures $NA \geq 0.85$, where values of $NA \geq 1$ can be obtained e.g. if used in conjunction with an immersion liquid.

US patent application US 2004/0120051 A1 based on international patent application PCT/EP03/01651 filed on Feb. 9, 2003 and claiming priority of provisional application 60/360,845 filed on Mar. 1, 2002 shows another refractive projection objective having one defined waist and negative lenses on the object-side entry.

International patent application PCT/EP03/01954 filed on Feb. 26, 2003 and claiming priority of DE 102 10 899.4 filed on Mar. 8, 2002 and corresponding to U.S. patent application Ser. No. 10/379,809 filed on Mar. 6, 2003 shows refractive projection objectives for immersion lithography designed as single-waist systems.

US patent application US 2004/0004757 A1 filed on May 5, 2003 and claiming priority of PCT/EP02/04846 filed on May 3, 2002 and DE 102 24 361 filed on May 24, 2002 discloses very-high aperture projection objectives designed as single-waist systems having a belly (or convexity) near the object, a belly near the image and a waist defined therebetween, where a negative group which has an effective curvature with a concave side directed towards the image is arranged in a region of divergent radiation between the waist and the system diaphragm arranged in the belly near the image. The disclosure of this document is incorporated herein by reference.

It is furthermore necessary, with the requirements set on a projection objective in microlithography, to use selected materials of high quality. Fluoride materials are in particular only available to a limited extent at present in the required quality. For example, at an exposure wavelength of 193 nm, a few lenses of calcium fluoride are used for compensation of chromatic aberration in projection objectives designed for this wavelength. Furthermore, calcium fluoride lenses, which are not so sensitive as regards compaction, are preferably used close in front of the wafer.

SUMMARY OF THE INVENTION

It is one object of the invention to provide a refractive projection objective which, with a high numerical aperture, has reduced production costs due to a reduced use of material. It is another object of the invention to provide a refractive projection objective which has an image side numerical aperture NA>0.7, a good correction of image aberrations and a small number of lenses. It is another object of the invention to provide a refractive projection objective which has an image side numerical aperture NA>0.7, a good colour correction and which can be manufactured from lenses made from one material only.

To address these and other objects the invention, according to one formulation of the invention, a refractive projection objective for microlithography with a numerical aperture NA greater than 0.7 is provided, consisting of:

a first lens group immediately following an object plane of the projection objective and having negative refractive power;

a second lens group immediately following the first lens group and having positive refractive power;

a third lens group immediately following the third lens group and having negative refractive power for generating a constriction of a light beam passing through the projection objective;

a fourth lens group immediately following the third lens group and having positive refractive power; and a fifth lens group immediately following the fourth lens group and having positive refractive power;

the projection objective thereby consisting of a first convexity, a second convexity, and a waist arranged between the first and second convexity, wherein the first convexity has a maximum diameter denoted by D1, and the second convexity has a maximum diameter denoted by D2, and wherein $0.8 < D_1/D_2 < 1.1$.

Reducing the maximum diameter of the second convexity was found particularly advantageous in the context of the above objects.

An arrangement of diverging lenses in the entry region of the objective, particularly of three negative lenses, contribute to the shortening of the projection objective, which advantageously affects the space requirement needed for the projection objective in the projection exposure device. Furthermore, a shortening of the projection objective also implies a reduction of the lenses used, so that the material used and the production costs can be reduced.

It has been found to be advantageous, for the compensation of spherical aberrations of higher order which are produced by a high numerical aperture in the end region of the projection objective, to provide strongly curved meniscuses which have negative refractive power and which are arranged between the narrowest constriction in the waist and the diaphragm and directly after the diaphragm.

It has been found to be advantageous that these meniscuses have a convex surface on the side turned toward the object.

According to another formulation it has been found advantageous in a projection objective which is designed as a purely refractive single-waist system with a belly (convexity) near the object, a belly (convexity) near the image and a waist therebetween, to arrange in a region of divergent radiation between the waist and the system diaphragm a negative group which has an effective curvature with a concave side directed towards the image. The negative group may be particularly beneficial in combination with a negative meniscus lens having an image side concave surface and arranged immediately behind the diaphragm. An object side negative meniscus of the negative group may be beneficial in combination with a meniscus lens having an image side convex surface immediately ahead. This meniscus lens may be a positive lens.

A "negative group" in this sense is a lens group with an overall negative refractive power, the lens group being able to comprise one or more lenses. The negative group is bent as a whole relative to the beam path as a result of the effective curvature. This curvature can be characterized by a surface of curvature whose centre of curvature is situated on the image side. The effective curvature of the lens (or of the surface of curvature) is characterized by a radius of curvature $r_c$ which is calculated as follows for a lens whose entry surface has the radius $r_1$ and whose exit surface has the radius $r_2$:

$$1/r_c = 1/(2*r_1) + 1/(2*r_2) \quad (1)$$

If the negative group comprises two or more lenses, the effective curvature of the group is calculated as follows:

$$1/r_c = 1/(n*r_1) + 1/(n*r_2) + 1/(n*r_3) + 1/(n*r_4) + \quad (2)$$

n specifying the number of surfaces.

Together with the divergence of the radiation in the region of the lenses, the effective curvature concave towards the image has the effect that high incidence angles occur particularly on the exit sides of the one or more lenses of the negative group. These are very effective above all for correcting aberrations of high order, in particular for aperture-dependent correction, (which act to overcorrect) of monochromatic aberrations in the image field zone and edge of the image field. Here, the negative group can create at least partially corrective functions such as would be possible otherwise only by providing a further waist.

In a development, the negative group comprises at least one lens with negative refractive power and a concave surface directed towards the image. By splitting, the negative refractive power can also be distributed over a plurality of such, consecutive lenses of negative refractive power, the centers of curvature for the image-side exit surfaces being situated in each case on the image side. Here, a particularly material-saving, compact design is possible in the case of the use of only one or two such lenses of negative refractive power. If two lenses are lined up, it is advantageous when the refractive power of the first, object-side lens is greater than that of the subsequent, image-side lens of the group. These negative lenses can be configured as negative meniscus lenses.

It has been found to be advantageous to provide two meniscuses between the narrowest constriction of the light beam in the waist and the diaphragm, with their convex lens surfaces turned toward each other.

It has furthermore been found to be advantageous to provide a free region in the second convexity, for the arrangement of a system diaphragm. It is possible, by providing this free region, to provide a diaphragm which is axially displaceable.

Furthermore, with a constructional space of this kind available for the arrangement of the diaphragm, the use of curved diaphragms is also provided for without problems.

It has been found to be advantageous to specifically select the lens surfaces provided so that the entry and exit angle of the ray falling on the lens, or the radiation leaving the lenses, is smaller than 60°. This measure has a particularly advantageous effect on the usable coatings of the lenses, or simpler coatings can be provided as antireflection coating, since the effectiveness of such coatings as an antireflection coating depends in particular on the angle of incidence of the incident radiation.

However, it was found that with high (image-side) numerical apertures beyond 0.7, such incident or exit angles at the refractive elements, namely lenses and cover plate (next to the image plane), in excess of 60 degrees are unavoidable. Now it was found that imaging errors produced by this can be advantageously compensated by some refractive elements within the objective, which have maximum incident or exit angles of just as high values exceeding 60 degrees. Preferred locations for these elements are given. Additionally, few elements having angles between 50 to 60 degrees are useful.

Further advantageous measures are described in further claims.

The invention is explained in detail using the following embodiment examples. These embodiment examples are not to be considered as limiting.

DETAILED DESCRIPTION OF THE PREFERRED EMBODIMENTS

Figure 1:
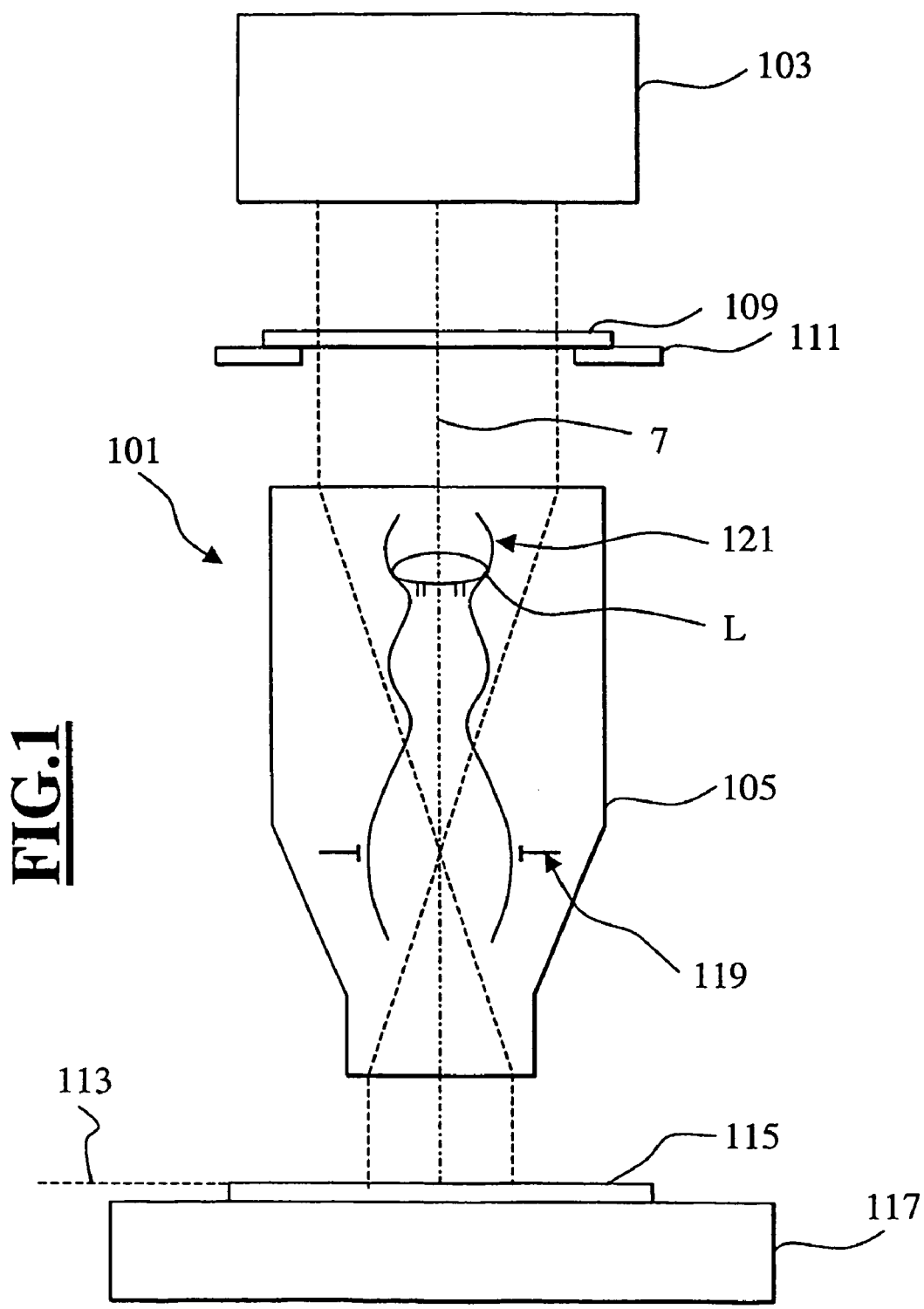
FIG. 1 shows a projection exposure device.

The principal construction of a projection exposure device 101 for microlithography is first described using FIG. 1. The projection exposure device 101 has an illuminating device 103 and a projection objective 105. The projection objective 105 includes a lens arrangement 121 with an aperture diaphragm 119, an optical axis 107 being defined by the lens arrangement 121.

A mask 109, held by a mask holder 111 in the beam path, is arranged between the illuminating device 103 and the projection objective 105. Such masks 109 used in microlithography have a micrometer to nanometer structure which is imaged with a reduction by a factor of up to 10, in particular by a factor of 4, by the projection objective 105 or respectively by the lens arrangement 121, on an image plane 113. A substrate or respectively a wafer 115 is held positioned by a substrate holder 117 in the image plane 113. The minimum structures which can still be resolved depend on the wavelength of the light used for the exposure and also on the aperture of the projection objective 115, the maximum attainable resolution of the projection exposure device increasing with decreasing wavelength and increasing image-side numerical aperture of the projection objective 105.

Figure 3:
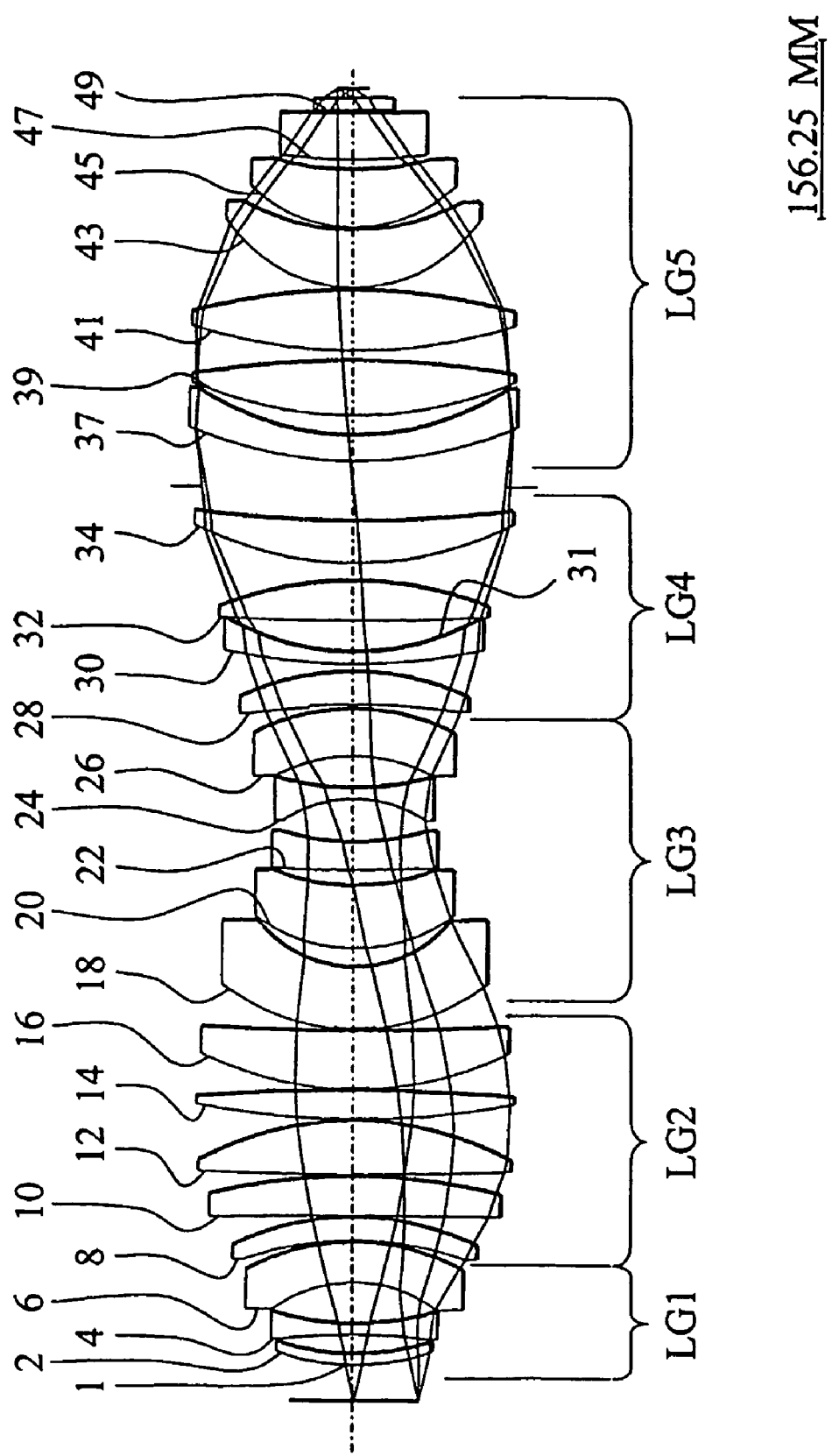
FIG. 3 shows a projection objective for the exposure wavelength 193 nm.
Figure 4:
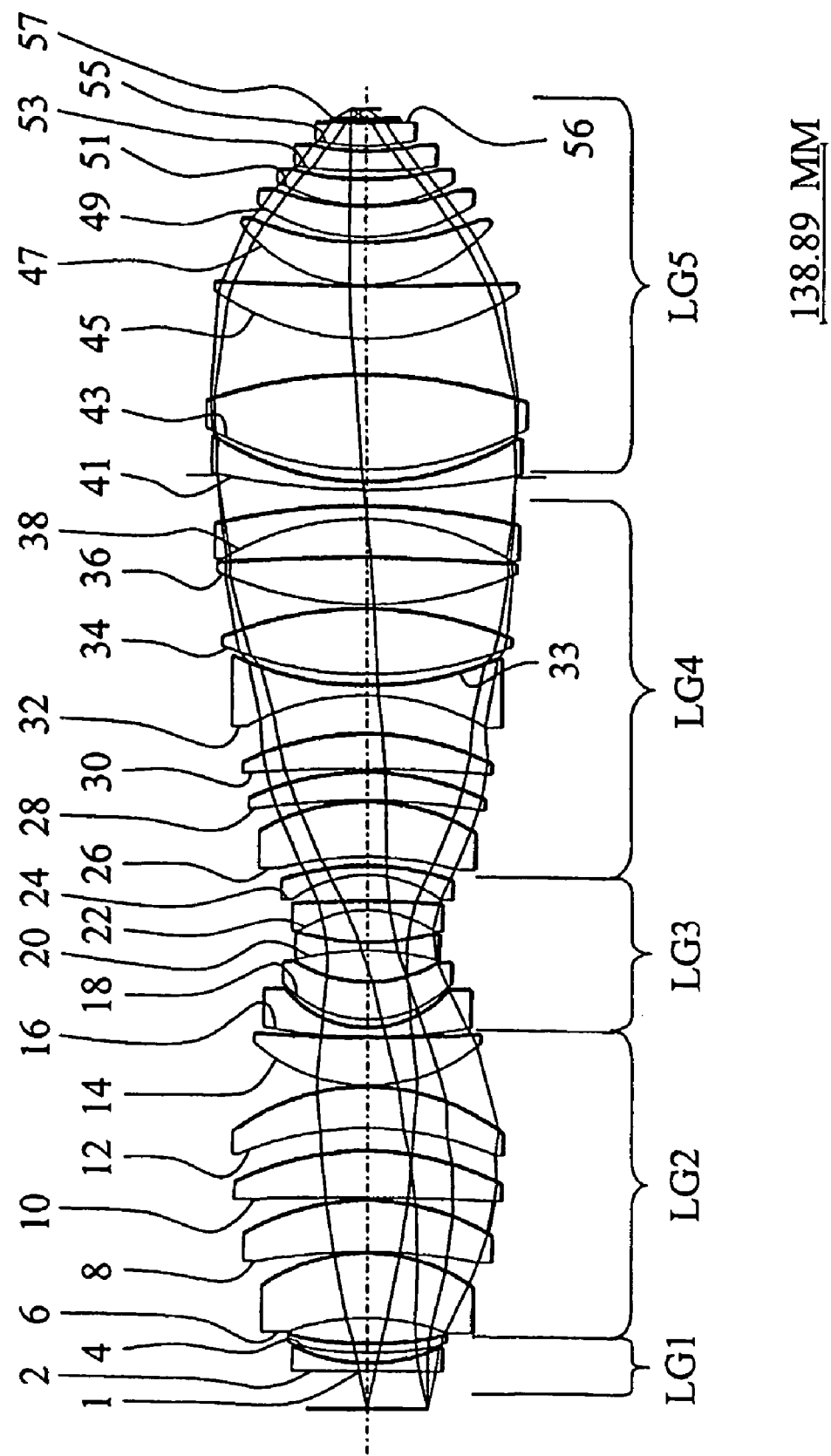
FIG. 4 shows a projection objective for the wavelength 193 nm.
Figure 5:
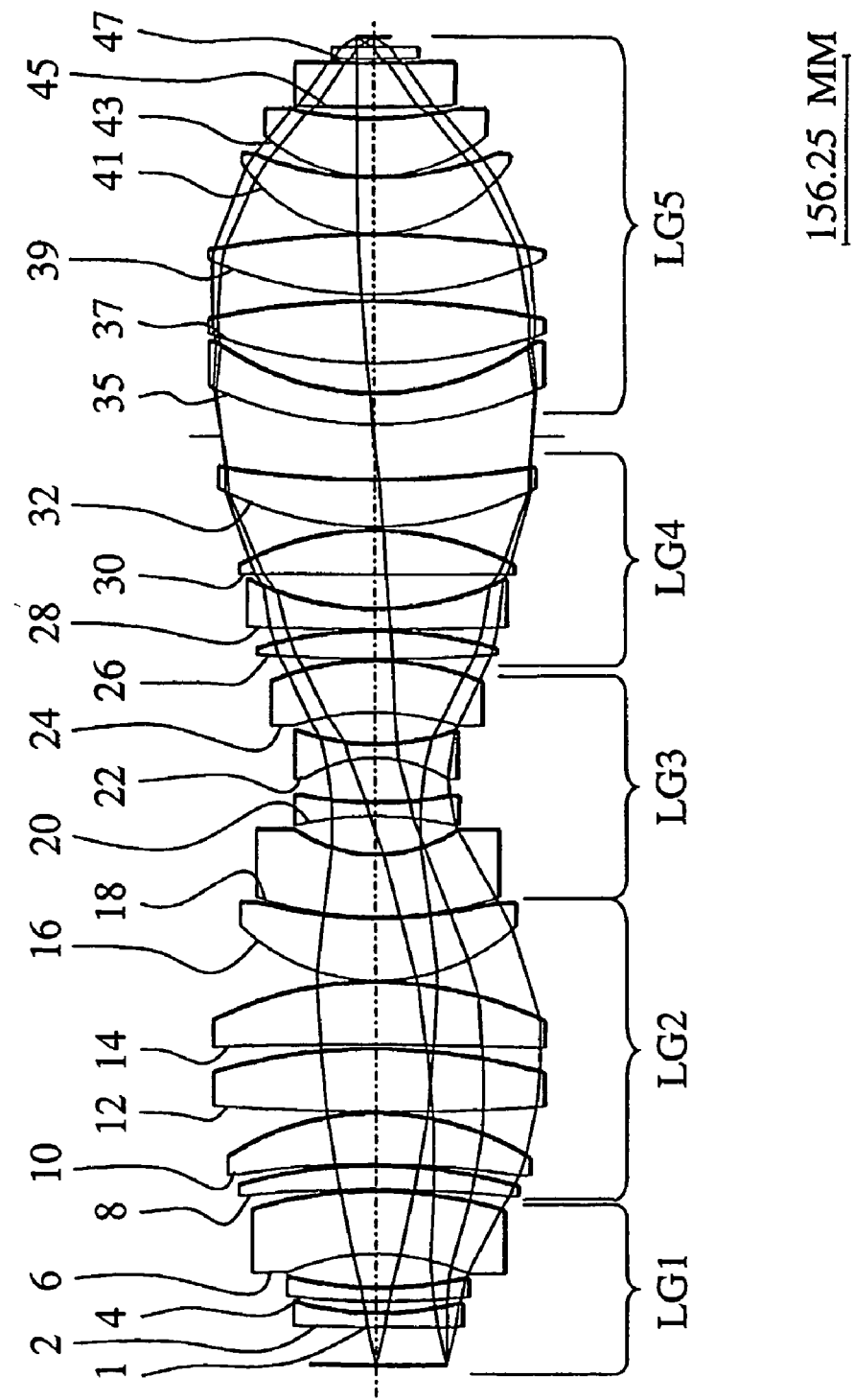
FIG. 5 shows a projection objective for the exposure wavelength 157 nm.

Possible lens arrangements 121 of the projection objective 105 are shown in detail in FIGS. 2–8. The lens arrangements 121 shown, which can also be termed designs, have an image-side numerical aperture of 0.85 or 0.9. The designs shown in FIGS. 2–4 and 6–8 are designed for the exposure wavelength of 193 nm. The projection objective shown in FIG. 5 is designed for the exposure wavelength of 157 nm. It is common to all these designs that the aberrations which arise are very small and thus structure widths down to 70 nm can be resolved. Here on the one hand the wavefront error is less than 5/1,000 of the wavelength of the light used for exposure, and on the other hand the distortion is smaller than 1 nm. The longitudinal chromatic error is smaller than 380 nm/pm. The large field size of 26×10.5 mm², in which the imaging is highly corrected in this fashion, makes productive use possible in microlithography. These projection objectives with such lens arrangements are especially suitable for use in lithographic scanning devices, because of the configuration of the field size or respectively of the field format.

Before going into the excellent optical properties of the lens arrangements 121 shown in FIGS. 2–8, the principal structure of these lens arrangements 121 will first be described in detail. In the propagation direction of the light beam, the lens arrangements 121 have a first convexity 123, a waist 125, and a second convexity 127. The waist 125 includes a place of narrowest constriction 129. A system diaphragm 119 is arranged in the second convexity.

These lens arrangements may also be divided into five lens groups LG1–LG5. The first lens group LG1 includes three negative lenses with the lens surfaces 2–7. The first two negative lenses are preferably curved toward the object. The third negative lens is preferably a meniscus lens which is curved toward the image. The second lens group LG2 adjoins this first lens group, and has positive refractive power, the lens of maximum diameter of the first convexity being arranged in this second lens group. This second lens group LG2 preferably includes exclusively lenses of positive refractive power.

The third lens group LG3 adjoins this lens group LG2 and has negative refractive power. This third lens group LG3 includes at least three successive lenses of negative refractive power. A fourth lens group LG4 adjoins this third lens group LG3 and has positive refractive power. This fourth lens group LG4 ends before the diaphragm.

A fifth lens group LG5 is formed by the lenses arranged after the system diaphragm 119, and likewise has positive refractive power. This fifth lens group LG5 includes a lens of maximum diameter in the second convexity, this diameter being denoted by D2.

All of these examples are distinguished by an excellent correction of the wavefront. The image errors which arise are corrected to values smaller than 5/1,000 of the wavelength. The principal ray distortion is connected to values smaller than 1 nm.

The advantageous effect of the present distribution of refractive power is amplified by the use of aspherics. The two aspherics on the diverging lenses in the first lens group LG1 serve principally for correction of the distortion and the object-side and image-side telecentricity of the principal rays of the outermost field point.

The third lens group LG3 begins with a weakly diverging meniscus lens, whose convex side is arranged turned toward the mask 109. This meniscus is followed by a lens with positive refractive power and at least two strongly diverging biconcave lenses. If aspherics are provided in this second lens group LG2, these are arranged on a concave surface turned toward the wafer. For the correction of higher terms of the aperture aberration and of the coma, at least one aspheric is arranged in each of the lens groups LG4 and LG5, or respectively before and after the diaphragm in the neighborhood of the greatest diameter of the second convexity. At least one diverging meniscus is arranged between the waist and the diaphragm, and thus in the fourth lens group LG4. In the preferred embodiments, FIGS. 2 and 3, this has a concave surface turned toward the wafer and hence a similar shape to the diverging meniscus following directly behind the diaphragm.

The state of correction is shown in FIGS. 2a–2c through FIGS. 7a–7c for each example, using curves of the spherical aberration, and of astigmatism, and the characteristics for the RMS value of the wavefront. The RMS values, which correspond to the mean square wavefront deformation, may be determined as follows:

$$W_{RMS} = \sqrt{(<W^2> - <W>^2)}$$

with W as wavefront error and the acute parentheses as operand for the formation of the mean value.

The longitudinal chromatic error CHL, which is determined as follows:

$$CHL = \frac{s'(\lambda_1) - s'(\lambda_2)}{\lambda_1 - \lambda_2}$$

is given in Table 1 (attached). Here s' is the paraxial image width after the last surface and $\lambda_1$ and $\lambda_2$ are reference wavelengths. CHL is given in nm per pm.

The choice of a single-waist system has an advantageous effect on the appearance of chromatic errors, which are usually corrected, as for example in WO 01/23935, by the use of at least two materials, for example, by $SiO_2$ and $CaF_2$ at a wavelength of 193 nm.

In contrast to this, in the embodiment examples shown in FIGS. 2–8, the use of only one material is provided, wherein outstanding image quality as regards chromatic aberrations could be attained precisely by the arrangement of the meniscuses provided after the position of the narrowest constriction. This image quality is distinguished by a longitudinal chromatic aberration or "axial color" smaller than 385 nm per pm. The color magnification aberration or "lateral color" is smaller than 0.8 ppm/pm, which represents an outstanding value. This corresponds to a color magnification aberration of 11 nm/pm at the image edge. (ppm stands for parts per million).

The use of a possible additional, second material can be provided for the correction of chromatic aberration and/or at places where a high energy density appears, to avoid compaction and rarefaction effects. Compaction and rarefaction effects mean here, changes of refractive index, depending on the material, in regions of high energy density.

The excellent image quality as regards chromatic aberration is supported by the shapes of the two convexities. The ratio of the maximum diameter of the first convexity, D1 and of the second convexity, D2, satisfies the following conditions:

$$0.8<D1/D2<1.1.$$

Preferably, $0.8<D1/D2<1.0$.

In the present examples, all the lens arrangements 121 have a numerical aperture of at least 0.85. However, it is of course possible to use this special arrangement in a lens arrangement which has a smaller image-side numerical aperture, in order to provide a larger field with unreduced image quality, or to further improve the image quality over the qualities shown using the embodiment examples, or to be able to reduce the use of aspherics. The designs are distinguished by small ray deflections or ray angle at most surfaces, in spite of high numerical aperture. Only small image aberrations of higher order are thereby generated.

Since the high angle of incidence in the neighborhood of the wafer on the lenses and the plane-parallel closure plate is unavoidable, aberrations of higher order are inevitably generated. In order to compensate these aberrations of higher order, few surfaces in the system are provided at which the incident radiation, or the radiation exiting from the lens, has a large angle of incidence or angle of refraction, which by choice of the sign opposes an aberration of higher order. In the examples, the strongly curved meniscuses are provided which have negative refractive power and which are arranged in the fourth and fifth lens groups. However, most of the lenses, at least 80% of all the lenses, have lens surfaces on which the entering light has an angle of incidence of less than 60°. The same holds for the lens surfaces at which the radiation exits again.

The possibilities of optimum coating of the lenses are thereby simplified, or respectively a back-reflection at the lens surfaces can be further reduced, since the effectiveness of such coatings depends strongly on the angle of incidence and as a rule decreases with increasing angle of incidence. It is not possible with a homogeneous layer system to obtain constant transmission over the whole surface and the full spectrum of the angle of incidence on the lens. Particularly in the transition zone of the angle region between 50° and 60°, the transmission worsens considerably with the same coating. It is therefore advantageous, firstly, to keep the angle of incidence in general as small as possible, and secondly, when large angles of incidence cannot be avoided for correction reasons, to position the lenses with the maximum angle of incidence in the neighborhood of the diaphragm. In this case, specific spectra of angle of incidence occur only in defined annular zones of the lens. In order to attain an optimum result as regards transmission, the coatings are varied in dependence on the radius, and thus are optimally matched to the respective region of angle of incidence.

These effects and advantages are shown here with purely refractive projection objectives, but in no way are limited to such, but as well apply to catadioptric projection objectives for microlithography, namely such with an image side refractive partial objective.

For the third embodiment according to FIG. 3, and Table 3, Table 3a gives the maximum incidence/exit angle measured in the optically thin medium (gas) Imax in degrees for each surface as in Table 3, plus the sine of the angle SINImax, which is directly comparable to the NA value. While the entrance and exit surface 49, 50 of the plane-parallel cover plate necessarily exceed Imax of 60 degrees with Imax=60, 70 degrees and the exit Imax of the last lens 47, 48 very nearly reaches the limit with Imax (48)=59.99 degrees. Here, exactly one lens surface 31 exceeds the limit, too, with Imax=60.51 degrees.

It is a negative meniscus lens situated between the object plane 0 and the system aperture 36, with the concave imageward surface 31 showing this extreme exit angle Imax=60.51 degrees, all this being preferred properties either singularly or in combination.

The fourth embodiment according to FIG. 4 and Table 4 has similar Imax properties shown in Table 4a. Cover plate 57, 58 closing the projection objective from the atmosphere at the image plane 60, where a wafer to be exposed is located, necessarily has an Imax=62 degrees, SIN Imax=0.88 equivalent to the (image side) numerical aperture NA. The exit surface 56 of the next lens 55, 56 also has an Imax (56)=61.28 degrees and also incident surface 53 of the third refractive element from the image plane has an Imax (53)=52.60 degrees exceeding 50 degrees.

Now, for compensation, it is provided by optical design choice, that also surfaces 33 and 34 in the lens arrangement between object plane 0 and system aperture 40 have Imax (33)=64.50 degrees and Imax (34)=61.22 degrees. Neighboring surfaces repeatedly lend themselves to this use of high Imax angles. Additional compensation is obtained by surfaces having Imax in the range between 50 degrees and 60 degrees. Neighboring surfaces 42 and 43 on two of the four lenses located next to the system aperture 40 have Imax (42)=57.28 degrees and Imax (43)=52.49 degrees. This is a preferred position for high Imax corrective elements.

Additionally, also in the first lens group LG1 neighboring surfaces 3 and 4 of the first and second lens show Imax (3)=59.47 degrees, almost=60 degrees, and Imax (4)=52.87 degrees, well in the additionally preferred 50 to 60 degree range.

The other incident angles are well kept down.

Figure 6:
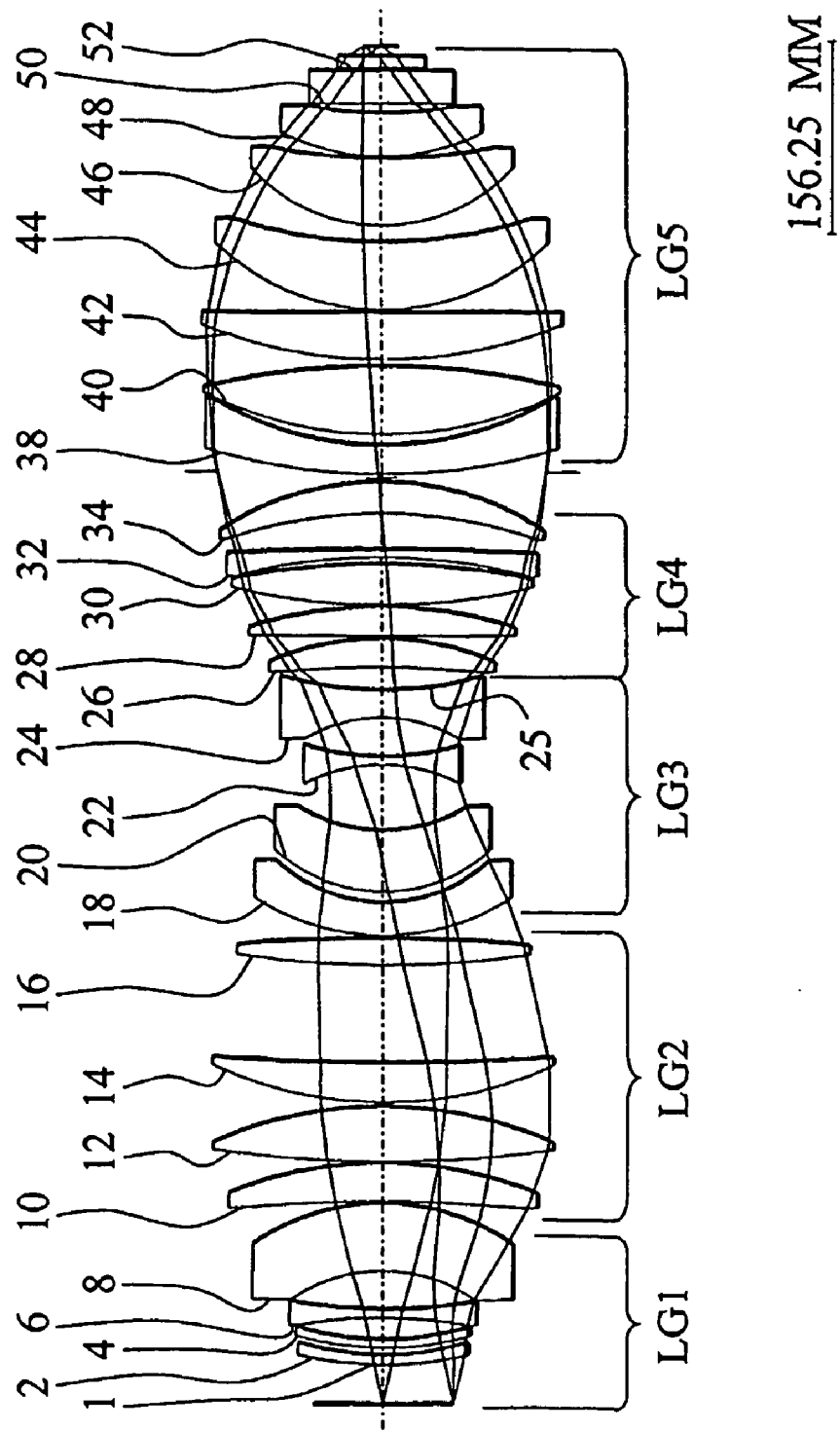
FIG. 6 shows a projection objective for the wavelength 193 nm.
Figure 6C:
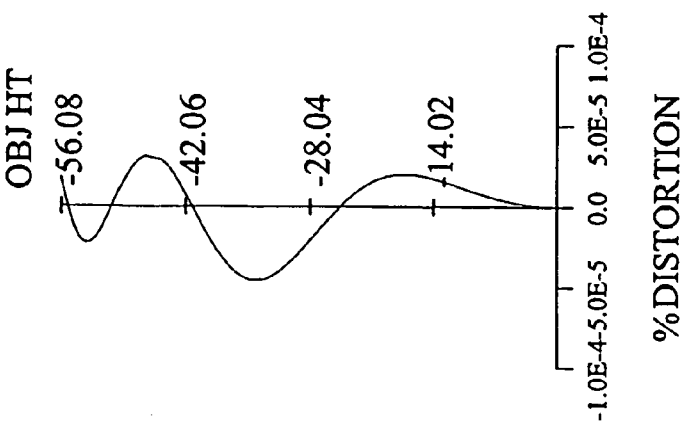
Figure 6B:
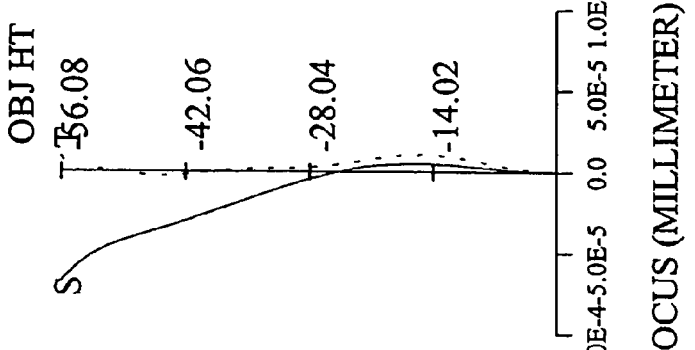
Figure 6A:
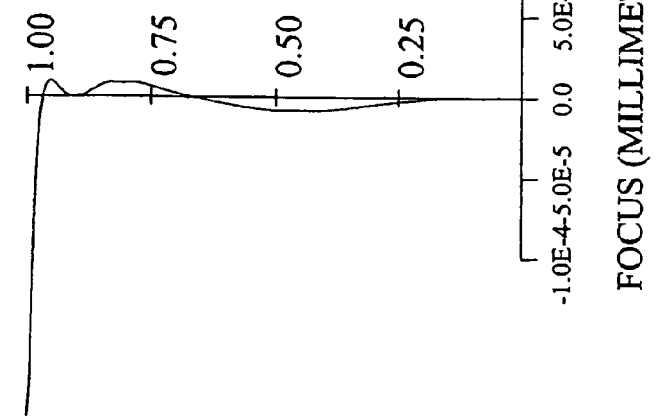

The sixth embodiment of FIG. 6, Table 6 and Table 6a shows Imax to exceed 60 degrees at the four surfaces of the two refractive elements next to the image plane 54, and specifically at surface 25 Imax (25)=65.26 degrees. This is situated at a location preferred by the inventors: between object plane 0 and aperture plane 37, on an image wise concave plane, thus being an exiting angle, and within negative lens group LG3, which consists of the four lenses next to the waist, which is effected by the locally minimum beam diameter (see data in sixth column of Table 6) at surface 23 of negative lenses 22, 23.

Additionally, surfaces 39 and 40 of lenses 38, 39 and 40, 41 show Imax (39)=58.11 degrees and Imax (40)=52.80 degrees as an assisting correction means with an Imax in the range from 50 degrees to 60 degrees. All the other surfaces within the object have well reduced Imax values, as normally preferable, with only surface 26 next to 25 reaching Imax (26)=45.11 degrees.

Besides, only the most imageward planar plates 50, 51 and 52, 53 show the Imax=61.15 degrees, necessitated by the required high incidence angle at the image plane (wafer plane) 54.

Figure 7:
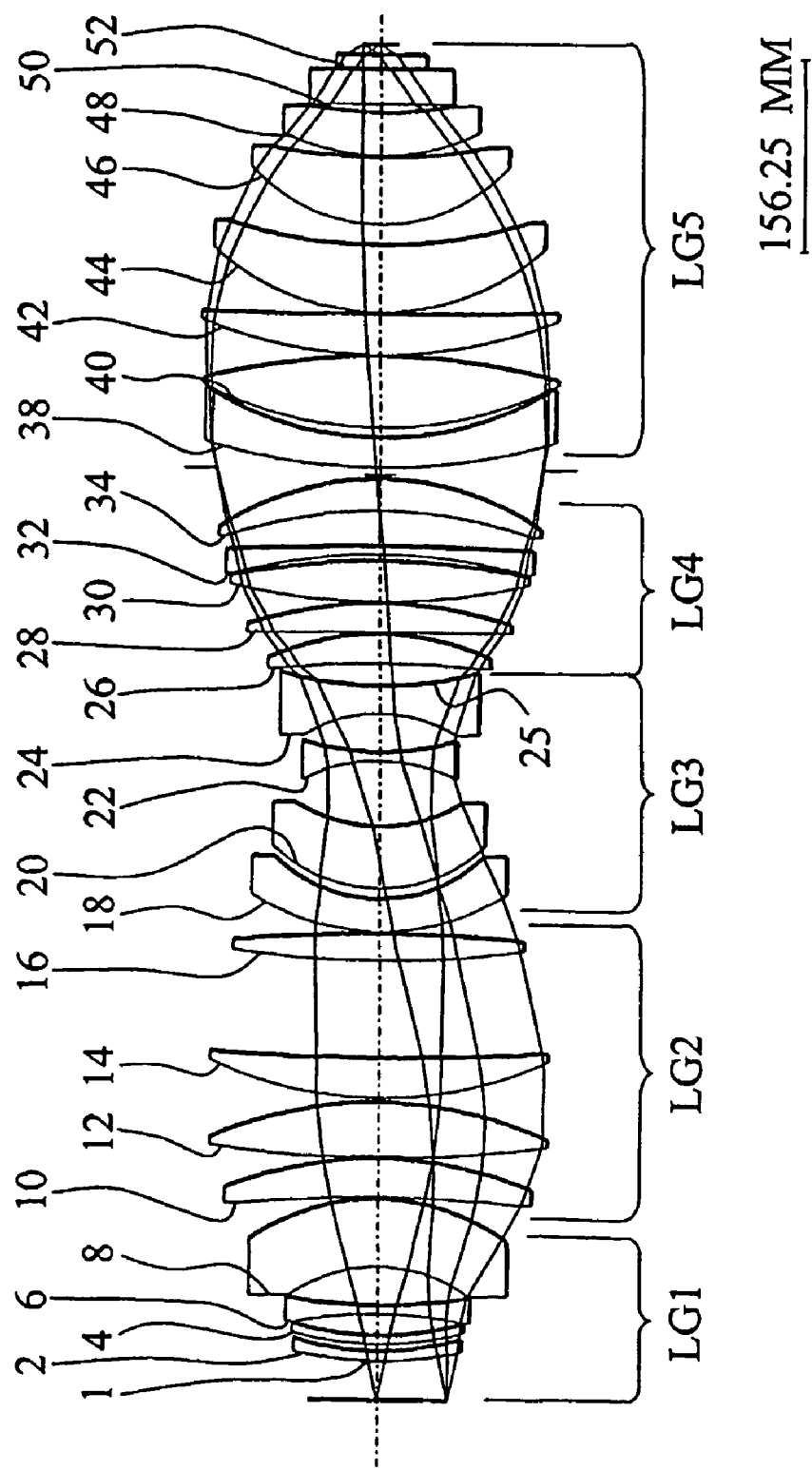
FIG. 7 shows a projection objective for the exposure wavelength 193 nm.

The seventh embodiment of FIG. 7, Tables 7 and 7a, is very similar with respect to Imax to the sixth embodiment.

Figure 8:
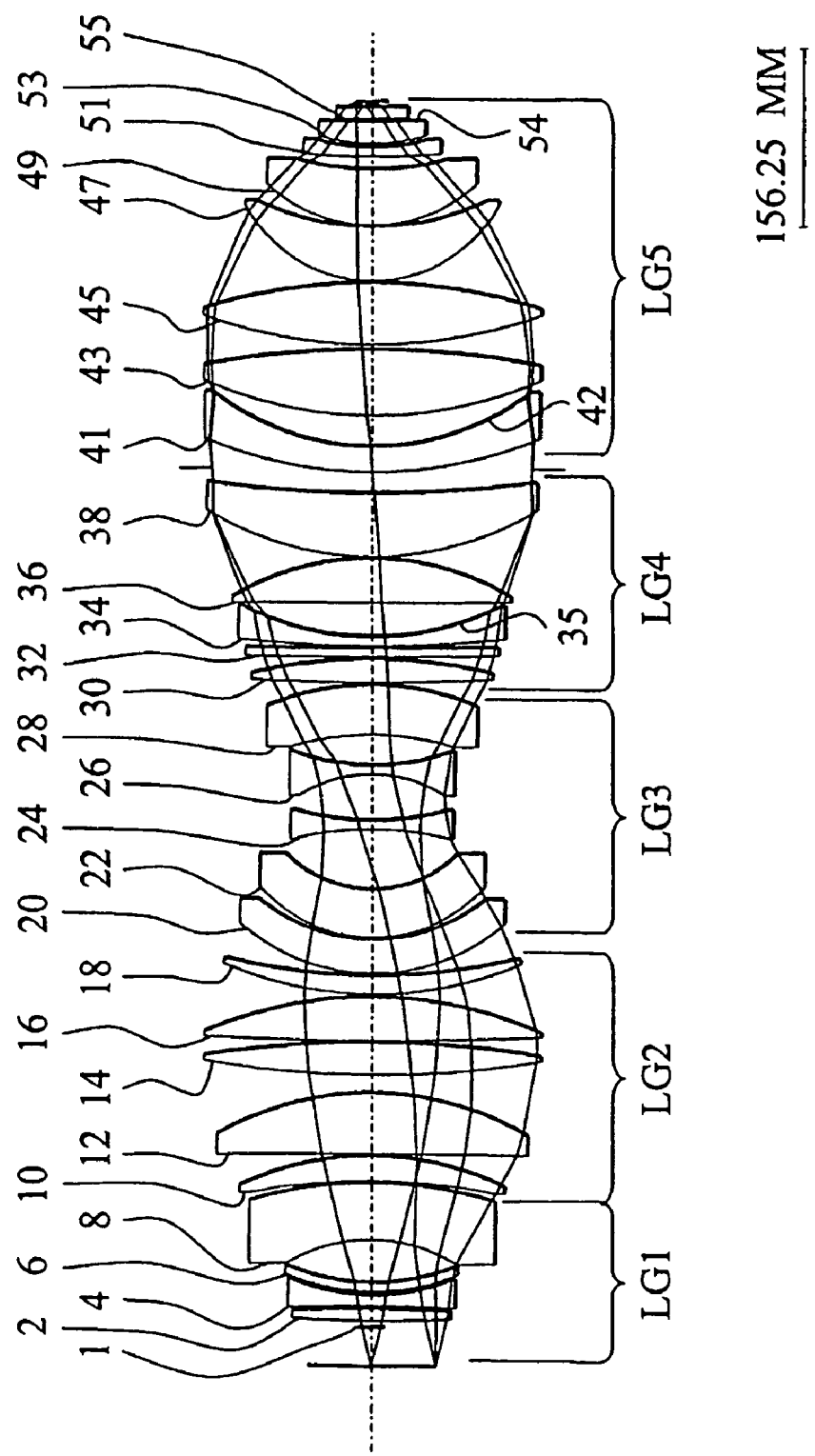
FIG. 8 shows a projection objective for the wavelength 193 nm.

The eighth embodiment of FIG. 8 and Tables 8, 8a has the highest (image side) numerical aperture NA=0.90, and therefore, poses the most stringent requirements of all aspects of lens design and construction.

The high NA value of 0.90 necessitates an angle of incidence at image/wafer plane 57 of Imax (57)=64.94 degrees, which inevitably is already given at the entrance and exit planes 55, 56 of the planar cover plate and at the planar exit plane 54 of the most imageward lens 53, 54.

Additionally, here, the concave entrance surface 51 of negative meniscus lens 51, 52 being the third refractive element from the image plane 57, shows Imax (51)=60.41 degrees and even exit surface 50 of the fourth refractive element 49, 50 from the image plane 57 has a value Imax (50)=54.37 degrees, above the 50 degree limit already having strong effects on reflection.

As a counter measure, according to the invention, negative meniscus lens 41, 42 second next to the system aperture 40 has an exit Imax (42)=61.53 degrees on the concave surface, and also negative meniscus lens 34, 35 situated between object plane 0 and system aperture 40 in lens group LG4 has an exit Imax (35)=63.97 degrees, counterbalancing the effects of the high angular load on the most imageward refractive elements at a preferred location.

An additional correcting high Imax is also provided on incident surface 38 of lens 38, 39 situated next to the system aperture 40, with an Imax (38)=54.37 degrees in the secondary preferred interval of 50 degrees–60 degrees. The two surfaces 42, 38 with high Imax so near to the system aperture are especially well suited for antireflective coatings with radially varying layers compensating towards uniform reflective suppression of different incident/exit angles, as here their distribution is to a high degree rotationally symmetric and radially increasing.

Also, in lens group LG3, surface 27 near the beam waist in this group has a corrective Imax (27)=50.21 degrees angle in a described, advantageous position.

Additionally, also in the first lens group, LG1, much as in embodiment 4, two neighboring surfaces 5, 6 show Imax (5)=50.60 degrees and Imax (6)=51.40 degrees in the 50 degree–60 degree region.

Other lens surfaces show well limited Imax angles as classically preferred.

It is to be noted that all tables recite surfaces in their sequence from the object plane 0, and that the drawings, FIGS. 2–8, show these sequential numbers, where for sake of clarity essentially only every second one is enscribed, the others easily to be deduced.

In order to be able to provide the most varied diaphragm systems in the designs shown, a free region, denoted by $L_{AP}$, is provided in the region of the diaphragm. Thereby diaphragms can be used which can be moved toward the image in dependence on requirements. The most varied diaphragms can also be used, and diaphragm mounts can be provided which already have a mechanism for displacing the diaphragm, since sufficient constructional space must be available for the provision of such a structure. The last two of the lenses arranged before the system diaphragm 119 have to contribute considerably to the possibility of providing the free space $L_{AP}$.

A reduction of the required lens material could be attained by means of the small diameter D1 and D2 in the two convexities 123, 127, and the short constructional length 1,000–1,150 mm and the small number of lenses. A lens mass m of less than 55 kg could be attained in a few embodiment examples; see Table 1. The lenses in the lens arrangements shown in FIGS. 2–9 are in the range of 54–68 kg.

Systems with large numerical aperture tend to require especially large diameter in the second convexity 127 and a large constructional length OO'. The design of the transition between the waist and the second convexity is important for attaining the small convexity diameter and the manageable constructional length. Two converging meniscuses are used here, with their convex sides turned toward each other. Because of this arrangement, the maximum lens diameter, and thus in particular the mass of the lens blank required, can be kept small due to the design of the second convexity. In order to attain as small a mass as possible, the following relationship must be maintained:

$$L \cdot D_{max}/(NA \cdot 2yb) < 12{,}850$$

where L is the constructional length measured from reticle to wafer, NA the image-side numerical aperture, $D_{MAX}$ the maximum diameter of the system, and is thus D1 or D2, and 2 yb is the diameter of the image field. It is particularly advantageous if the maximum diameter of the first convexity D1 is at most equal to the maximum diameter of the second convexity D2.

The data characterizing the respective lens arrangements 121 are given in the following Table 1 (attached). $L_{geo}$ is the sum of the middle thicknesses of all the lenses of the objective. LV is a measure for the free constructional space around a system diaphragm, $L_{AP}$ being the free distance from the last lens surface before the diaphragm as far as the first lens surface after the diaphragm.

$$LV = \frac{2 \cdot L_{AP} \cdot \left(\frac{L_{geo}}{L - L_{AP}}\right)}{L}$$

$L_{geo}$ is the sum over the middle thicknesses of all the lenses arranged in the objective and L is the distance from the image plane O' to the object plane O.

Figure 2:
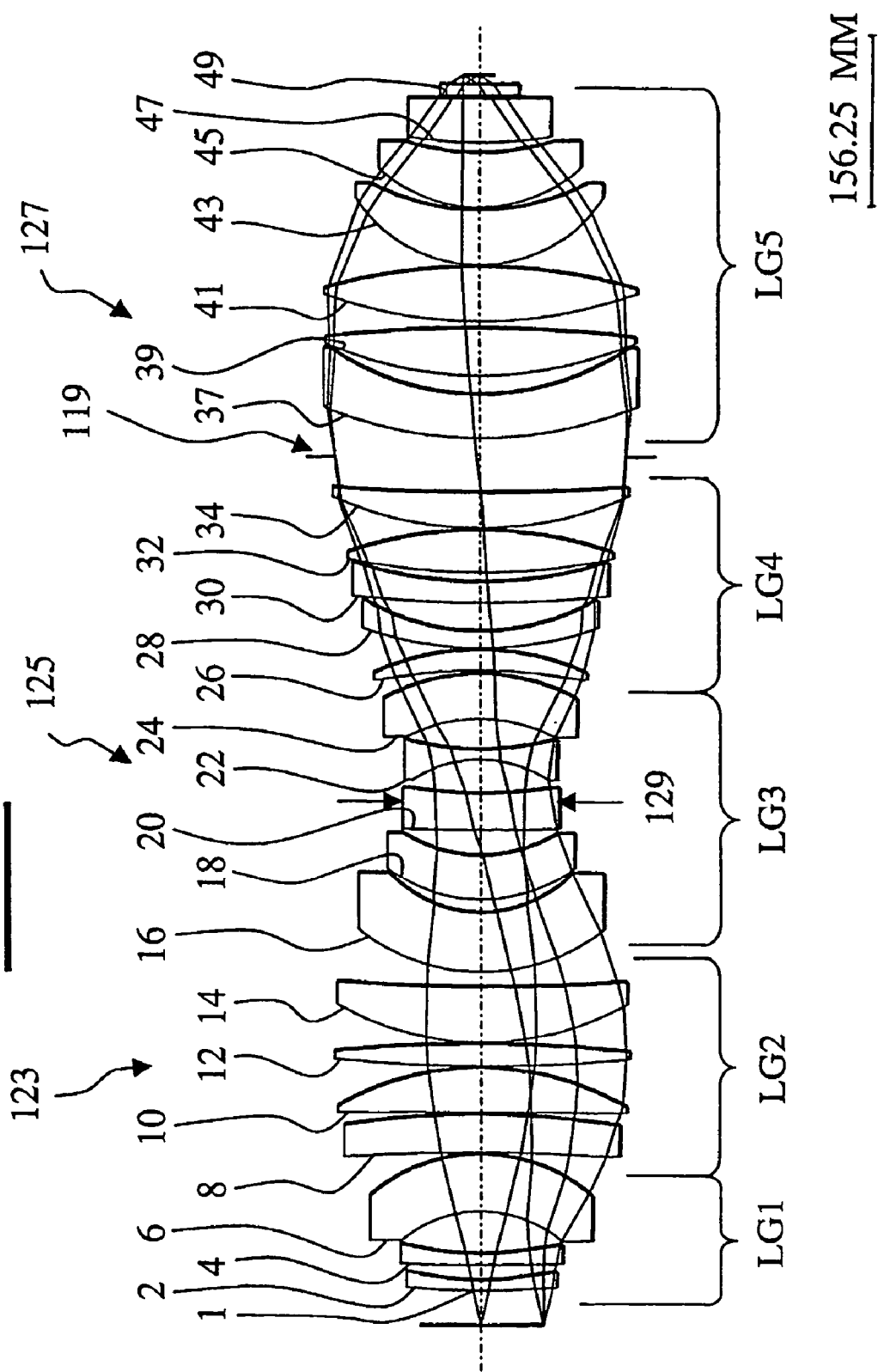
FIG. 2 shows a projection objective for the wavelength 193 nm.

The exact lens data of the lens arrangement shown in FIG. 2 can be gathered from Table 2 (attached).

The aspheric surfaces are described by the equation $$P(h) = \frac{\delta \cdot h^2}{1 + \sqrt{1 - (1-K) \cdot \delta^2 \cdot h^2}} + C_1 h^4 + \ldots + C_n h^{2n+2} \qquad \delta = 1/R$$

where P is the sagitta as a function of the radius h (height to the optical axis 7) with the aspheric constants K, $C_1$–$C_n$ given in the Tables. R is the vertex radius given in the Tables.

In FIGS. 2a–2c, the distribution of the image errors over the image is shown. In FIG. 2a, the spherical longitudinal aberration is shown, with the relative aperture on the vertical axis and the longitudinal aberration on the horizontal axis. The course of the astigmatism can be gathered from FIG. 2b.

The object height is plotted in the vertical axis and the defocusing (mm) on the horizontal axis. The distortion is shown in FIG. 2c, the distortion in % on the horizontal axis being plotted against the object height on the vertical axis.

The exact lens data for the lens arrangement shown in FIG. 3 can be gathered from Table 3 and Table 3a (attached).

The spherical aberration, astigmatism and distortion are shown in FIGS. 3a–3c as already described for FIGS. 2a–2c.

The exact lens data for the lens arrangement shown in FIG. 4 can be gathered from Table 4 and Table 4a (attached).

The imaging quality as regards spherical aberration, astigmatism and distortion is shown in FIGS. 4a–4c.

The exact lens data for the lens arrangement shown in FIG. 5 can be gathered from Table 5 (attached).

The exact lens data for the lens arrangement shown in FIG. 6 can be gathered from Table 6 and Table 6a (attached). Similarly, for Tables 7 and 7a and 8 and 8a, attached.

The above description of the preferred embodiments has been given by way of example. The individual features may be implemented either alone or in combination as embodiments of the invention, or may be implemented in other fields of application. Further, they may represent advantageous embodiments that are protectable in their own right, for which protection is claimed in the application as filed or for which protection will be claimed during pendency of the application. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

TABLE 1

| | NA | $D_1$ mm | $D_2$ mm | L = 00' mm | $L_{AP}$ mm | $L_{geo}$ mm | $D_1/D_2$ | Field $mm^2$ | Number of asph | $\lambda$ in nm | CHL nm/ pm | m kg | LV | $\dfrac{NA \cdot L}{D_{MAX}}$ |
|---|---|---|---|---|---|---|---|---|---|---|---|---|---|---|
| FIG. 2 | 0.85 | 258.7 | 275.3 | 1150 | 49.6 | 821.7 | 0.94 | 26 × 10.5 | 8 | 193 | 380.5 | 63 | 0.13 | 3.55 |
| FIG. 3 | 0.85 | 266.7 | 279.4 | 1150 | 52.1 | 810.6 | 0.95 | 26 × 10.5 | 8 | 193 | 384.9 | 63 | 0.14 | 3.50 |
| FIG. 4 | 0.85 | 199.5 | 235.8 | 999.8 | 12.5 | 688.5 | 0.85 | 22 × 6 | 8 | 157 | 529.5 | 57 | 0.04 | 3.6 |
| FIG. 5 | 0.85 | 260 | 264 | 1100 | 46.1 | 794.5 | 0.98 | 26 × 10.5 | 8 | 193 | 370 | 60 | 0.13 | 3.54 |
| FIG. 6 | 0.85 | 263.9 | 277.6 | 1098 | 6 | 728 | 0.95 | 26 × 10.5 | 6 | 193 | 396 | 54 | 0.016 | 3.36 |
| FIG. 7 | 0.85 | 263.9 | 277.8 | 1098 | 9 | 726 | 0.95 | 26 × 10.5 | 6 | 193 | 392 | 54 | 0.023 | 3.36 |
| FIG. 8 | 0.92 | 284.2 | 285 | 1107 | 18 | 777.2 | 1 | 26 × 10.5 | 9 | 1193 | 374 | 60 | 0.05 | 3.5 |

TABLE 2

| SURFACE | RADIUS | THICKNESS | GLASSES | REFRACTIVE INDEX | ½ FREE DIAMETER |
|---|---|---|---|---|---|
| 0 | 0.000000000 | 32.000000000 | L710 | 0.99998200 | 56.080 |
| 1 | 0.000000000 | 0.000000000 | L710 | 0.99998200 | 63.104 |
| 2 | 727.642869160 | 10.000000000 | SIO2HL | 1.56028895 | 63.718 |
| 3 | 226.525323855AS | 13.700039256 | KE193 | 0.99971200 | 65.318 |
| 4 | 2211.534901544 | 10.867348809 | SIO2HL | 1.56028895 | 67.362 |
| 5 | 272.198328283AS | 38.109427988 | HE193 | 0.99971200 | 70.568 |
| 6 | −110.268448226 | 53.110762192 | SIO2HL | 1.56028895 | 71.923 |
| 7 | −150.645587119 | 1.027970654 | HE193 | 0.99971200 | 97.325 |
| 8 | −1859.686377061 | 35.612645698 | SIO2HL | 1.56028895 | 112.154 |
| 9 | −785.737931706 | 1.605632266 | HE193 | 0.99971200 | 120.907 |
| 10 | −15567.860026603 | 41.231791248 | SIO2HL | 1.56028895 | 124.874 |
| 11 | −255.699077104 | 1.000000000 | HE193 | 0.99971200 | 126.787 |
| 12 | 1289.315128841 | 21.016190377 | SIO2HL | 1.56028895 | 129.339 |
| 13 | −1288.131288834 | 1.000000000 | HE193 | 0.99971200 | 129.365 |
| 14 | 260.564227287 | 51.423634995 | SIO2HL | 1.56028895 | 127.263 |
| 15 | 1730.695425203 | 13.188971653 | HE193 | 0.99971200 | 122.159 |
| 16 | 176.011027540 | 55.000000000 | SIO2HL | 1.56028895 | 107.596 |
| 17 | 109.644556647 | 11.784016964 | HE193 | 0.99971200 | 81.889 |
| 18 | 136.796552665 | 41.333702101 | SIO2HL | 1.56028895 | 81.527 |
| 19 | 127.780585003 | 23.051923975 | HE193 | 0.99971200 | 68.904 |
| 20 | 2669.368605391 | 34.121643610 | SIO2HL | 1.56028895 | 68.053 |
| 21 | 355.264577081AS | 30.898497897 | HE193 | 0.99971200 | 62.218 |
| 22 | −109.389008884 | 10.000000000 | SIO2HL | 1.56028895 | 61.017 |
| 23 | 249.223110659 | 27.598291596 | HE193 | 0.99971200 | 66.233 |
| 24 | −143.820224710 | 42.179010727 | SIO2HL | 1.56028895 | 67.085 |
| 25 | −176.696299845 | 2.479524938 | HE193 | 0.99971200 | 84.196 |
| 26 | −475.210722340AS | 19.825006874 | SIO2HL | 1.56028895 | 90.545 |
| 27 | −224.363382582 | 1.042633596 | HE193 | 0.99971200 | 93.106 |
| 28 | 308.609848426 | 16.000000000 | SIO2HL | 1.56028895 | 102.746 |
| 29 | 201.721667456 | 25.528839747 | HE193 | 0.99971200 | 103.303 |
| 30 | 944.687071148AS | 19.894794059 | SIO2HL | 1.56028895 | 104.495 |
| 31 | 366.820570030 | 8.208658436 | HE193 | 0.99971200 | 112.097 |
| 32 | 574.278724113 | 39.477814236 | SIO2HL | 1.56028895 | 113.555 |
| 33 | −358.531323193 | 1.326991422 | HE193 | 0.99971200 | 116.205 |
| 34 | 320.594715977AS | 33.261672159 | SIO2HL | 1.56028895 | 129.696 |
| 35 | 1861.755729783 | 32.119103109 | HE193 | 0.99971200 | 129.674 |
| 36 | 0.000000000 | 17.287410699 | HE193 | 0.99971200 | 130.664 |
| 37 | 361.690129139 | 40.443225527 | SIO2HL | 1.56028895 | 137.657 |

TABLE 2-continued

| | | | | | |
|---|---|---|---|---|---|
| 38 | 232.801533112 | 17.100750060 | HE193 | 0.99971200 | 134.775 |
| 39 | 343.521129222 | 43.749080263 | SIO2HL | 1.56028895 | 135.562 |
| 40 | −1180.085155420 | 5.861047182 | HE193 | 0.99971200 | 136.059 |
| 41 | 404.126406350 | 50.820935982 | SIO2HL | 1.56028895 | 137.263 |
| 42 | −499.905302311AS | 1.129115320 | HE193 | 0.99971200 | 136.399 |
| 43 | 132.000000000 | 50.889776270 | SIO2HL | 1.56028895 | 108.737 |
| 44 | 207.781260330 | 1.875778948 | HE193 | 0.99971200 | 96.990 |
| 45 | 131.976080166 | 50.620041025 | SIO2HL | 1.56028895 | 88.265 |
| 46 | 216.108478997 | 8.560819690 | HE193 | 0.99971200 | 66.515 |
| 47 | 345.785473120AS | 40.780402187 | SIO2HL | 1.56028895 | 62.290 |
| 48 | 803.014748992 | 2.855378377 | HE193 | 0.99971200 | 37.054 |
| 49 | 0.000000000 | 10.000000000 | SIO2HL | 1.56028895 | 33.755 |
| 50 | 0.000000000 | 8.000000000 | L710 | 0.99998200 | 27.205 |
| 51 | 0.000000000 | 0.000000000 | | 1.00000000 | 14.020 |

ASPHERIC CONSTANTS:

SURFACE NR. 3

| | |
|---|---|
| K | 0.0000 |
| C1 | −1.09559753e−007 |
| C2 | 3.57696534e−012 |
| C3 | 9.55681903e−017 |
| C4 | 1.60627093e−020 |
| C5 | −2.38364411e−024 |
| C6 | 9.48007957e−029 |
| C7 | 6.17790835e−034 |
| C8 | 0.00000000e+000 |
| C9 | 0.00000000e+000 |

SURFACE NR. 5

| | |
|---|---|
| K | 0.0000 |
| C1 | −3.98669984e−008 |
| C2 | 1.21202773e−012 |
| C3 | −2.54482855e−016 |
| C4 | 2.63372160e−020 |
| C5 | −7.20324194e−024 |
| C6 | 1.11610638e−027 |
| C7 | −6.59707609e−032 |
| C8 | 0.00000000e+000 |
| C9 | 0.00000000e+000 |

SURFACE NR. 21

| | |
|---|---|
| K | 0.0000 |
| C1 | −2.55118726e−008 |
| C2 | −2.20548948e−012 |
| C3 | −9.25235857e−017 |
| C4 | −3.33206057e−020 |
| C5 | 6.94726983e−024 |
| C6 | −1.13902882e−027 |
| C7 | −1.90433265e−032 |
| C8 | 0.00000000e+000 |
| C9 | 0.00000000e+000 |

SURFACE NR. 26

| | |
|---|---|
| K | 0.0000 |
| C1 | −2.59102407e−009 |
| C2 | 7.80412785e−013 |
| C3 | 6.46009507e−018 |
| C4 | 9.48615754e−022 |
| C5 | −5.98580637e−026 |
| C6 | −6.85408327e−031 |
| C7 | −1.22088512e−035 |
| C8 | 0.00000000e+000 |
| C9 | 0.00000000e+000 |

SURFACE NR. 30

| | |
|---|---|
| K | 0.0000 |
| C1 | −2.05499169e−009 |
| C2 | −9.59524174e−014 |
| C3 | 3.47471870e−018 |
| C4 | −1.59033679e−023 |
| C5 | 3.61312920e−027 |
| C6 | 4.19166365e−031 |
| C7 | −6.21964399e−036 |
| C8 | 0.00000000e+000 |
| C9 | 0.00000000e+000 |

TABLE 2-continued

SURFACE NR. 34

| | |
|---|---|
| K | 0.0000 |
| C1 | −5.41197196e−011 |
| C2 | 2.68576256e−014 |
| C3 | 1.97154224e−018 |
| C4 | −1.14136005e−023 |
| C5 | −6.50140227e−029 |
| C6 | −1.62666510e−032 |
| C7 | 1.03803879e−037 |
| C8 | 0.00000000e+000 |
| C9 | 0.00000000e−000 |

SURFACE NR. 42

| | |
|---|---|
| K | 0.0000 |
| C1 | 4.81397179e−010 |
| C2 | −9.43105453e−016 |
| C3 | 2.24359599e−019 |
| C4 | 4.36770636e−024 |
| C5 | −6.88569878e−028 |
| C6 | 4.99976924e−033 |
| C7 | −3.38683104e−039 |
| C8 | 0.00000000e+000 |
| C9 | 0.00000000e+000 |

SURFACE NR. 47

| | |
|---|---|
| K | 0.0000 |
| C1 | −3.38379388e−008 |
| C2 | 1.92297513e−012 |
| C3 | 3.68388126e−016 |
| C4 | −4.26261424e−020 |
| C5 | −7.93153105e−025 |
| C6 | 5.33775440e−028 |
| C7 | −3.98605335e−032 |
| C8 | 0.00000000e+000 |
| C9 | 0.00000000e+000 |

TABLE 3

| SURFACE | RADIUS | THICKNESS | GLASSES | REFRACTIVE INDEX 193.304 nm | ½ FREE DIAMETER |
|---|---|---|---|---|---|
| 0 | 0.000000000 | 32.000000000 | L710 | 0.99998200 | 56.080 |
| 1 | 0.000000000 | 0.000000000 | L710 | 0.99998200 | 63.102 |
| 2 | 225.350754363AS | 10.000000000 | SIO2HL | 1.56028895 | 65.569 |
| 3 | 205.452906258 | 16.699011276 | HE193 | 0.99971200 | 65.485 |
| 4 | −485.968436889AS | 10.000000000 | SIO2HL | 1.56028895 | 65.851 |
| 5 | 236.120586098 | 35.991435570 | HE193 | 0.99971200 | 69.716 |
| 6 | −118.383252950 | 35.248541973 | SIO2HL | 1.56028895 | 70.715 |
| 7 | −199.283119032 | 1.000000000 | HE193 | 0.99971200 | 91.711 |
| 8 | −297.219107904 | 20.818099956 | SIO2HL | 1.56028895 | 96.216 |
| 9 | −242.015290785 | 1.012986192 | HE193 | 0.99971200 | 103.186 |
| 10 | −8025.596542346 | 34.642805711 | SIO2HL | 1.56028895 | 115.500 |
| 11 | −527.541918500 | 1.061404340 | HE193 | 0.99971200 | 122.264 |
| 12 | 2846.863909159 | 47.490572144 | SIO2HL | 1.56028895 | 129.024 |
| 13 | −281.527506472 | 1.000000000 | HE193 | 0.99971200 | 131.520 |
| 14 | 720.498316615 | 25.197751101 | SIO2HL | 1.56028895 | 133.348 |
| 15 | −1864.287720284 | 1.000000000 | HE193 | 0.99971200 | 133.010 |
| 16 | 297.151930333 | 51.479599832 | SIO2HL | 1.56028895 | 129.235 |
| 17 | 2167.873564789 | 1.204618080 | HE193 | 0.99971200 | 123.220 |
| 18 | 188.319913743 | 55.000000000 | SIO2HL | 1.56028895 | 111.397 |
| 19 | 108.153510038 | 15.971910183 | HE193 | 0.99971200 | 83.783 |
| 20 | 148.002390368 | 55.000000000 | SIO2HL | 1.56028895 | 83.477 |
| 21 | 190.335908124 | 13.500103985 | HE193 | 0.99971200 | 69.512 |
| 22 | 1443.253928436 | 24.323718717 | SIO2HL | 1.56028895 | 68.921 |
| 23 | 199.695044391AS | 37.573461703 | HE193 | 0.99971200 | 62.387 |
| 24 | −111.551299373 | 10.000000000 | SIO2HL | 1.56028895 | 60.784 |
| 25 | 239.358614085 | 27.666487186 | HE193 | 0.99971200 | 65.748 |
| 26 | −142.880130573 | 41.866297159 | SIO2HL | 1.56028895 | 66.580 |
| 27 | −189.902057474 | 1.589605652 | HE193 | 0.99971200 | 84.173 |
| 28 | −748.290216502AS | 29.582545265 | SIO2HL | 1.56028895 | 90.858 |
| 29 | −233.966894232 | 8.147720844 | HE193 | 0.99971200 | 95.596 |
| 30 | 522.113109615 | 10.822356285 | SIO2HL | 1.56028895 | 105.238 |
| 31 | 222.998461180 | 27.042016978 | HE193 | 0.99971200 | 107.333 |
| 32 | 2251.467600263 | 35.217263658 | SIO2HL | 1.56028895 | 108.549 |

TABLE 3-continued

| | | | | | |
|---|---|---|---|---|---|
| 33 | −318.234735893 | 15.214352753 | HE193 | 0.99971200 | 112.335 |
| 34 | 299.639863140 | 37.156335602 | SIO2HL | 1.56028895 | 130.529 |
| 35 | 1065.209248614AS | 29.625427714 | HE193 | 0.99971200 | 130.316 |
| 36 | 0.000000000 | 22.504097096 | HE193 | 0.99971200 | 131.300 |
| 37 | 354.298294212 | 22.700275111 | SIO2HL | 1.56028895 | 139.703 |
| 38 | 238.221108961 | 17.302866825 | HE193 | 0.99971200 | 137.684 |
| 39 | 350.361961049 | 48.201285092 | SIO2HL | 1.56028895 | 138.456 |
| 40 | −830.182582275AS | 8.553043233 | HE193 | 0.99971200 | 138.929 |
| 41 | 451.152609432 | 53.706250069 | SIO2HL | 1.56028895 | 138.872 |
| 42 | −529.782985076 | 2.080488115 | HE193 | 0.99971200 | 137.286 |
| 43 | 131.667284180 | 50.882399067 | SIO2HL | 1.56028895 | 108.852 |
| 44 | 197.437143555 | 1.961444642 | HE193 | 0.99971200 | 96.477 |
| 45 | 128.459992965 | 50.613576955 | SIO2HL | 1.56028895 | 87.931 |
| 46 | 248.183667913 | 8.856875224 | HE193 | 0.99971200 | 67.641 |
| 47 | 466.791868973AS | 40.667719468 | SIO2HL | 1.56028895 | 63.096 |
| 48 | 942.984808834 | 2.803249134 | HE193 | 0.99971200 | 37.242 |
| 49 | 0.000000000 | 10.000000000 | SIO2HL | 1.56028895 | 33.823 |
| 50 | 0.000000000 | 8.020000000 | L710 | 0.99998200 | 27.268 |
| 51 | 0.000000000 | 0.000000000 | | 1.00000000 | 14.021 |

ASPHERIC CONSTANTS

SURFACE NR. 2

| | |
|---|---|
| K | 0.0000 |
| C1 | 9.00497722e−008 |
| C2 | −2.96761245e−012 |
| C3 | 2.42426411e−016 |
| C4 | −1.29024008e−020 |
| C5 | −2.03172826e−024 |
| C6 | 5.50185705e−028 |
| C7 | −3.89197744e−032 |
| C8 | 0.00000000e+000 |
| C9 | 0.00000000e+000 |

SURFACE NR. 4

| | |
|---|---|
| K | 0.0000 |
| C1 | 3.65969250e−008 |
| C2 | −1.92473151e−012 |
| C3 | −1.32665803e−016 |
| C4 | 5.69164703e−021 |
| C5 | 1.31041719e−024 |
| C6 | −1.53054324e−028 |
| C7 | 9.97324868e−033 |
| C8 | 0.00000000e+000 |
| C9 | 0.00000000e+000 |

SURFACE NR. 23

| | |
|---|---|
| K | 0.0000 |
| C1 | −1.27989150e−008 |
| C2 | −3.88749373e−012 |
| C3 | −2.51584504e−016 |
| C4 | −8.45723879e−021 |
| C5 | −7.11343179e−024 |
| C6 | 1.64378151e−027 |
| C7 | −2.17615886e−031 |
| C8 | 0.00000000e+000 |
| C9 | 0.00000000e+000 |

SURFACE NR. 28

| | |
|---|---|
| K | 0.0000 |
| C1 | −1.03153490e−008 |
| C2 | 6.25910971e−013 |
| C3 | 5.45981131e−018 |
| C4 | 9.75498051e−022 |
| C5 | −1.22736867e−025 |
| C6 | 1.17406737e−029 |
| C7 | −5.81094482e−034 |
| C8 | 0.00000000e+000 |
| C9 | 0.00000000e+000 |

SURFACE NR. 35

| | |
|---|---|
| K | 0.0000 |
| C1 | 5.28759000e−010 |
| C2 | 1.51806496e−014 |
| C3 | −1.87647477e−018 |
| C4 | −1.08308029e−023 |
| C5 | −9.74605211e−028 |
| C6 | 6.03242407e−032 |

TABLE 3-continued

| | | |
|---|---|---|
| | C7 | −5.09796873e−037 |
| | C8 | 0.00000000e+000 |
| | C9 | 0.00000000e+000 |
| | SURFACE NR. 40 | |
| | K | 0.0000 |
| | C1 | 1.83813349e−010 |
| | C2 | 3.19321009e−015 |
| | C3 | 2.04249906e−019 |
| | C4 | 6.57531812e−024 |
| | C5 | −2.09352644e−028 |
| | C6 | 1.60987553e−033 |
| | C7 | −2.90466412e−037 |
| | C8 | 0.00000000e+000 |
| | C9 | 0.00000000e+000 |
| | SURFACE NR. 47 | |
| | K | 0.0000 |
| | C1 | −3.99800644e−008 |
| | C2 | 4.05930779e−012 |
| | C3 | 1.42362123e−016 |
| | C4 | −3.12437665e−020 |
| | C5 | −5.49454012e−024 |
| | C6 | 1.84641101e−027 |
| | C7 | −1.54565739e−031 |
| | C8 | 0.00000000e+000 |
| | C9 | 0.00000000e+000 |

TABLE 3a

| Surface | SINImax | Imax [deg] |
|---|---|---|
| 0 | | |
| 1 | 0.218 | 12.59 |
| 2 | 0.5596 | 34.03 |
| 3 | 0.488 | 29.21 |
| 4 | 0.3003 | 17.48 |
| 5 | 0.692 | 43.79 |
| 6 | 0.4085 | 24.11 |
| 7 | 0.2147 | 12.40 |
| 8 | 0.222 | 12.83 |
| 9 | 0.2023 | 11.67 |
| 10 | 0.459 | 27.32 |
| 11 | 0.1467 | 8.44 |
| 12 | 0.3916 | 23.05 |
| 13 | 0.4332 | 25.67 |
| 14 | 0.2266 | 13.10 |
| 15 | 0.22 | 12.71 |
| 16 | 0.3403 | 19.90 |
| 17 | 0.2733 | 15.86 |
| 18 | 0.2988 | 17.39 |
| 19 | 0.6767 | 42.59 |
| 20 | 0.4381 | 25.98 |
| 21 | 0.3087 | 17.98 |
| 22 | 0.3104 | 18.08 |
| 23 | 0.3781 | 22.22 |
| 24 | 0.6747 | 42.43 |
| 25 | 0.6352 | 39.43 |
| 26 | 0.2639 | 15.30 |
| 27 | 0.2167 | 12.52 |
| 28 | 0.4209 | 24.89 |
| 29 | 0.1783 | 10.27 |
| 30 | 0.521 | 31.40 |
| 31 | 0.8704 | 60.51 |
| 32 | 0.6151 | 37.96 |
| 33 | 0.0764 | 4.38 |
| 34 | 0.7263 | 46.58 |
| 35 | 0.2744 | 15.93 |
| 36 | 0.1613 | 9.28 |
| 37 | 0.5276 | 31.84 |
| 38 | 0.8146 | 54.55 |
| 39 | 0.682 | 43.00 |
| 40 | 0.2792 | 16.21 |
| 41 | 0.2977 | 17.32 |
| 42 | 0.6416 | 39.91 |
| 43 | 0.5727 | 34.94 |
| 44 | 0.2767 | 16.06 |
| 45 | 0.1175 | 6.75 |
| 46 | 0.7045 | 44.79 |
| 47 | 0.7818 | 51.43 |
| 48 | 0.8659 | 59.99 |
| 49 | 0.8721 | 60.70 |
| 50 | 0.8721 | 60.70 |
| 51 | 0.8721 | 60.70 |

TABLE 4

| SURFACE | RADIUS | THICKNESS | GLASSES | REFRACTIVE INDEX 157.6 nm | ½ FREE DIAMETER |
|---|---|---|---|---|---|
| 0 | 0.000000000 | 29.091200000 | N2 | 1.00000300 | 46.170 |
| 1 | 0.000000000 | 0.050360271 | N2 | 1.00000300 | 52.536 |
| 2 | −27403.121890329 | 6.400000000 | CAF2HL | 1.55848720 | 52.536 |

TABLE 4-continued

| | | | | | |
|---|---|---|---|---|---|
| 3 | 128.789046652 | 8.167826938 | N2 | 1.00000300 | 55.162 |
| 4 | 464.481828994AS | 6.543292509 | CAF2HL | 1.55848720 | 56.851 |
| 5 | 250.689303807 | 19.604013184 | N2 | 1.00000300 | 58.208 |
| 6 | −223.266447510AS | 50.327605169 | CAF2HL | 1.55848720 | 59.504 |
| 7 | −141.012345914 | 0.896857450 | N2 | 1.00000300 | 77.821 |
| 8 | −492.125790935 | 39.701273305 | CAF2HL | 1.55848720 | 84.708 |
| 9 | −185.333140083 | 1.620061449 | N2 | 1.00000300 | 91.930 |
| 10 | −4917.002616489AS | 36.075373094 | CAF2HL | 1.55848720 | 96.618 |
| 11 | −224.975412381 | 17.499455417 | N2 | 1.00000300 | 98.628 |
| 12 | −249.735183706 | 31.779981213 | CAF2HL | 1.55848720 | 97.516 |
| 13 | −169.147720350 | 1.273004772 | N2 | 1.00000300 | 99.721 |
| 14 | 131.492053134 | 36.312876809 | CAF2HL | 1.55848720 | 83.706 |
| 15 | 1183.761281348 | 0.820000000 | N2 | 1.00000300 | 79.822 |
| 16 | 446.400836562 | 6.793752445 | CAF2HL | 1.55848720 | 76.456 |
| 17 | 80.708201634 | 6.438487413 | N2 | 1.00000300 | 62.135 |
| 18 | 88.076542641 | 28.609450919 | CAF2HL | 1.55848720 | 61.689 |
| 19 | 103.290384365 | 24.140118330 | N2 | 1.00000300 | 53.717 |
| 20 | −214.410142174 | 6.400000000 | CAF2HL | 1.55848720 | 52.881 |
| 21 | 166.705978193AS | 25.336749078 | N2 | 1.00000300 | 50.734 |
| 22 | −86.759432429 | 6.718880984 | CAF2HL | 1.55848720 | 50.602 |
| 23 | −895.255217870 | 20.208808365 | N2 | 1.00000300 | 55.126 |
| 24 | −94.182592644 | 7.167405034 | CAF2HL | 1.55848720 | 56.136 |
| 25 | −199.256306511 | 6.787427649 | N2 | 1.00000300 | 63.043 |
| 26 | −257.348011065 | 42.358250101 | CAF2HL | 1.55848720 | 67.198 |
| 27 | −158.070327885 | 0.915908375 | N2 | 1.00000300 | 79.706 |
| 28 | −536.887928001 | 21.844348944 | CAF2HL | 1.55848720 | 84.997 |
| 29 | −205.950312449 | 2.162149307 | N2 | 1.00000300 | 87.472 |
| 30 | −1845.287959821AS | 27.220459982 | CAF2HL | 1.55848720 | 90.588 |
| 31 | −211.608710551 | 29.606451754 | N2 | 1.00000300 | 91.877 |
| 32 | −183.434679441 | 7.418912892 | CAF2HL | 1.55848720 | 90.562 |
| 33 | 240.988713790 | 8.623094130 | N2 | 1.00000300 | 99.368 |
| 34 | 286.816486745 | 50.566486028 | CAF2HL | 1.55848720 | 104.285 |
| 35 | −278.974234663 | 3.401812568 | N2 | 1.00000300 | 106.263 |
| 36 | 272.985081433 | 35.883815357 | CAF2HL | 1.55848720 | 110.387 |
| 37 | −1204.561658666AS | 29.820606892 | N2 | 1.00000300 | 109.520 |
| 38 | −205.963439341 | 9.589085190 | CAF2HL | 1.55848720 | 108.972 |
| 39 | −486.467956109 | 23.105163626 | N2 | 1.00000300 | 111.820 |
| 40 | 0.000000000 | −10.633177329 | N2 | 1.00000300 | 113.000 |
| 41 | 520.246306609AS | 6.400000000 | CAF2HL | 1.55848720 | 113.282 |
| 42 | 210.835739690 | 9.380949546 | N2 | 1.00000300 | 113.819 |
| 43 | 249.610235127 | 72.661056858 | CAF2HL | 1.55848720 | 116.283 |
| 44 | −368.944153695 | 27.617582877 | N2 | 1.00000300 | 118.001 |
| 45 | 194.602406707AS | 40.994994726 | CAF2HL | 1.55848720 | 111.496 |
| 46 | 2325.171902613 | 0.959912478 | N2 | 1.00000300 | 108.992 |
| 47 | 120.131289340 | 32.489921154 | CAF2HL | 1.55848720 | 91.646 |
| 48 | 219.061234205 | 4.330384877 | N2 | 1.00000300 | 86.556 |
| 49 | 148.308513415 | 23.818571196 | CAF2HL | 1.55848720 | 79.114 |
| 50 | 203.105155430 | 0.826871809 | N2 | 1.00000300 | 69.446 |
| 51 | 136.769195322 | 19.729069306 | CAF2HL | 1.55848720 | 64.538 |
| 52 | 210.657871509 | 6.502120434 | N2 | 1.00000300 | 55.515 |
| 53 | 376.287223054 | 15.336785456 | CAF2HL | 1.55848720 | 51.778 |
| 54 | 183.572236231 | 4.060877180 | N2 | 1.00000300 | 40.084 |
| 55 | 181.243374040 | 16.948210271 | CAF2HL | 1.55848720 | 36.115 |
| 56 | 426.075165306 | 1.398093981 | N2 | 1.00000300 | 26.107 |
| 57 | 0.000000000 | 2.400024000 | CAF2HL | 1.55848720 | 25.121 |
| 58 | 0.000000000 | 7.272800000 | N2 | 1.00000300 | 23.545 |
| 59 | 0.000000000 | 0.000000000 | N2 | 1.00000300 | 11.543 |
| 60 | 0.000000000 | 0.000000000 | | 1.00000000 | 11.543 |

ASPHERIC CONSTANTS

SURFACE NR. 4

| | |
|---|---|
| K | 0.0000 |
| C1 | 3.68947301e−007 |
| C2 | −2.07010320e−011 |
| C3 | 1.80448893e−015 |
| C4 | −2.02024724e−019 |
| C5 | 1.06591750e−023 |
| C6 | 8.66812157e−027 |
| C7 | −1.28036020e−030 |
| C8 | 0.00000000e+000 |
| C9 | 0.00000000e+000 |

SURFACE NR. 6

| | |
|---|---|
| K | 0.0000 |
| C1 | −1.90456699e−007 |
| C2 | 7.09276542e−012 |
| C3 | −9.42039479e−016 |

TABLE 4-continued

| | |
|---|---|
| C4 | 9.60030375e−020 |
| C5 | −4.81313543e−023 |
| C6 | 1.26016542e−026 |
| C7 | −2.12906900e−030 |
| C8 | 0.00000000e+000 |
| C9 | 0.00000000e+000 |

SURFACE NR. 10

| | |
|---|---|
| K | 0.0000 |
| C1 | 1.24881874e−009 |
| C2 | −7.54632592e−013 |
| C3 | 9.59548418e−018 |
| C4 | 3.61424148e−022 |
| C5 | 4.66204361e−026 |
| C6 | −5.18069760e−030 |
| C7 | 6.76055535e−035 |
| C8 | 0.00000000e+000 |
| C9 | 0.00000000e+000 |

SURFACE NR. 21

| | |
|---|---|
| K | 0.0000 |
| C1 | −1.78468549e−007 |
| C2 | −5.04642691e−012 |
| C3 | −9.31857452e−016 |
| C4 | 2.41285214e−019 |
| C5 | −1.68512636e−022 |
| C6 | 5.20287108e−026 |
| C7 | −7.17032999e−030 |
| C8 | 0.00000000e+000 |
| C9 | 0.00000000e+000 |

SURFACE NR. 30

| | |
|---|---|
| K | 0.0000 |
| C1 | −1.34161725e−008 |
| C2 | 8.16970893e−014 |
| C3 | −3.14061744e−018 |
| C4 | 1.03237892e−021 |
| C5 | −1.84717130e−025 |
| C6 | 1.87170281e−029 |
| C7 | −7.93751880e−034 |
| C8 | 0.00000000e+000 |
| C9 | 0.00000000e+000 |

SURFACE NR. 37

| | |
|---|---|
| K | 0.0000 |
| C1 | 7.99945890e−009 |
| C2 | −1.42636834e−013 |
| C3 | −2.69989142e−019 |
| C4 | −5.15246689e−023 |
| C5 | −4.83470243e−027 |
| C6 | 2.58478622e−031 |
| C7 | −7.74164486e−036 |
| C8 | 0.00000000e+000 |
| C9 | 0.00000000e+000 |

SURFACE NR. 41

| | |
|---|---|
| K | 0.0000 |
| C1 | −4.43364674e−009 |
| C2 | 1.10741132e−014 |
| C3 | 3.55153523e−018 |
| C4 | −4.85210428e−024 |
| C5 | 2.35336826e−027 |
| C6 | −1.03253172e−031 |
| C7 | 4.79327883e−036 |
| C8 | 0.00000000e+000 |
| C9 | 0.00000000e+000 |

SURFACE NR. 45

| | |
|---|---|
| K | 0.0000 |
| C1 | −1.18399241e−009 |
| C2 | −1.58492270e−013 |
| C3 | −1.27975554e−018 |
| C4 | −1.10519991e−022 |
| C5 | 2.24373710e−027 |
| C6 | −9.77335519e−032 |
| C7 | −5.74659204e−036 |
| C8 | 0.00000000e+000 |
| C9 | 0.00000000e+000 |

TABLE 4a

| surface | SINImax | Imax [deg] |
|---|---|---|
| 0 | | |
| 1 | 0.218 | 12.59 |
| 2 | 0.2161 | 12.48 |
| 3 | 0.8614 | 59.47 |
| 4 | 0.7973 | 52.87 |
| 5 | 0.6657 | 41.74 |
| 6 | 0.2409 | 13.94 |
| 7 | 0.3638 | 21.33 |
| 8 | 0.2152 | 12.43 |
| 9 | 0.3613 | 21.18 |
| 10 | 0.1713 | 9.86 |
| 11 | 0.4861 | 29.08 |
| 12 | 0.4386 | 26.01 |
| 13 | 0.7713 | 50.47 |
| 14 | 0.4394 | 26.07 |
| 15 | 0.5238 | 31.59 |
| 16 | 0.4299 | 25.46 |
| 17 | 0.6585 | 41.19 |
| 18 | 0.5754 | 35.13 |
| 19 | 0.2938 | 17.09 |
| 20 | 0.5461 | 33.10 |
| 21 | 0.3959 | 23.32 |
| 22 | 0.6334 | 39.30 |
| 23 | 0.4332 | 25.67 |
| 24 | 0.3413 | 19.96 |
| 25 | 0.3862 | 22.72 |
| 26 | 0.4018 | 23.69 |
| 27 | 0.2041 | 11.78 |
| 28 | 0.3328 | 19.44 |
| 29 | 0.2731 | 15.85 |
| 30 | 0.2821 | 16.39 |
| 31 | 0.4873 | 29.16 |
| 32 | 0.5471 | 33.17 |
| 33 | 0.9026 | 64.50 |
| 34 | 0.8765 | 61.22 |
| 35 | 0.3044 | 17.72 |
| 36 | 0.5741 | 35.04 |

TABLE 4a-continued

| surface | SINImax | Imax [deg] |
|---|---|---|
| 37 | 0.2652 | 15.38 |
| 38 | 0.7108 | 45.30 |
| 39 | 0.2008 | 11.58 |
| 40 | 0.1463 | 8.41 |
| 41 | 0.3362 | 19.65 |
| 42 | 0.8413 | 57.28 |
| 43 | 0.7932 | 52.49 |
| 44 | 0.5042 | 30.28 |
| 45 | 0.4773 | 28.51 |
| 46 | 0.4358 | 25.84 |
| 47 | 0.4411 | 26.17 |
| 48 | 0.3751 | 22.03 |
| 49 | 0.2544 | 14.74 |
| 50 | 0.545 | 33.02 |
| 51 | 0.4465 | 26.52 |
| 52 | 0.7277 | 46.69 |
| 53 | 0.7944 | 52.60 |
| 54 | 0.7452 | 48.18 |
| 55 | 0.7614 | 49.59 |
| 56 | 0.877 | 61.28 |
| 57 | 0.8838 | 62.10 |
| 58 | 0.8853 | 62.29 |
| 59 | 0.8838 | 62.10 |
| 60 | 0.8838 | 62.10 |

TABLE 5

| SURFACE | RADIUS | THICKNESS | GLASSES | REFRACTIVE INDEX 193.304 nm | ½ FREE DIAMETER |
|---|---|---|---|---|---|
| 0 | 0.000000000 | 32.000000000 | LUFTV193 | 1.00030168 | 56.080 |
| 1 | 0.000000000 | 0.000000000 | LUFTV193 | 1.00030168 | 63.258 |
| 2 | −1268.338705527AS | 11.478260873 | SIO2V | 1.56078570 | 63.258 |
| 3 | 267.538117540 | 9.451447213 | N2VP950 | 1.00029966 | 65.916 |
| 4 | 600.021131212AS | 11.500000000 | SIO2V | 1.56078570 | 67.578 |
| 5 | 326.741991833 | 28.091498045 | N2VP950 | 1.00029966 | 70.893 |
| 6 | −170.788507842 | 51.999135922 | SIO2V | 1.56078570 | 72.910 |
| 7 | −330.329053389 | 1.000000000 | N2VP950 | 1.00029966 | 99.226 |
| 8 | −1068.525517497 | 19.979625145 | SIO2V | 1.56078570 | 105.942 |
| 9 | −387.645501150 | 1.000000000 | N2VP950 | 1.00029966 | 109.709 |
| 10 | −704.568730532AS | 42.420550373 | SIO2V | 1.56078570 | 113.373 |
| 11 | −222.016287024 | 1.000000000 | N2VP950 | 1.00029966 | 119.118 |
| 12 | 1941.257887377 | 52.000000000 | SIO2V | 1.56078570 | 126.942 |
| 13 | −469.372066662 | 3.397916884 | N2VP950 | 1.00029966 | 129.896 |
| 14 | −4169.926875111 | 52.000000000 | SIO2V | 1.56078570 | 129.822 |
| 15 | −295.686690038 | 1.000000000 | N2VP950 | 1.00029966 | 130.032 |
| 16 | 159.750938231 | 51.964442356 | SIO2V | 1.56078570 | 108.529 |
| 17 | 376.268786269 | 1.000000000 | N2VP950 | 1.00029966 | 97.568 |
| 18 | 307.447954470 | 51.969227450 | SIO2V | 1.56078570 | 95.447 |
| 19 | 116.498974152 | 31.898186858 | N2VP950 | 1.00029966 | 65.905 |
| 20 | −288.097826092 | 11.500000000 | SIO2V | 1.56078570 | 64.079 |
| 21 | 336.397895010AS | 37.099202165 | N2VP950 | 1.00029966 | 60.053 |
| 22 | −106.320408238 | 11.500000000 | SIO2V | 1.56078570 | 58.050 |
| 23 | 187.789793825 | 26.304322413 | N2VP950 | 1.00029966 | 63.753 |
| 24 | −209.237460909 | 43.406094751 | SIO2V | 1.56078570 | 66.044 |
| 25 | −216.929048076 | 1.000000000 | N2VP950 | 1.00029966 | 82.840 |
| 26 | 1164.410193579AS | 23.567441112 | SIO2V | 1.56078570 | 92.682 |
| 27 | −329.001203575 | 1.000000000 | N2VP950 | 1.00029966 | 94.132 |
| 28 | 2521.852603301 | 17.217391310 | SIO2V | 1.56078570 | 97.558 |
| 29 | 228.980652217 | 28.589394523 | N2VP950 | 1.00029966 | 102.117 |

TABLE 5-continued

| | | | | | |
|---|---|---|---|---|---|
| 30 | 27241.479244975 | 36.454077888 | SIO2V | 1.56078570 | 105.084 |
| 31 | −230.122916051 | 2.961510546 | N2VP950 | 1.00029966 | 108.362 |
| 32 | 270.925118464 | 38.714553103 | SIO2V | 1.56078570 | 124.500 |
| 33 | 763.688485160AS | 35.762711758 | N2VP950 | 1.00029966 | 123.913 |
| 34 | 0.000000000 | 10.298384083 | N2VP950 | 1.00029966 | 124.951 |
| 35 | 305.539519440 | 25.677979598 | SIO2V | 1.56078570 | 131.506 |
| 36 | 216.211099364 | 24.769069040 | N2VP950 | 1.00029966 | 128.830 |
| 37 | 382.860100127 | 50.973600009 | SIO2V | 1.56078570 | 130.799 |
| 38 | −694.560467360AS | 5.723480057 | N2VP950 | 1.00029966 | 131.956 |
| 39 | 325.403745866 | 49.444778918 | SIO2V | 1.56078570 | 131.961 |
| 40 | −731.949523671 | 1.000000000 | N2VP950 | 1.00029966 | 130.439 |
| 41 | 129.520874552 | 46.268119852 | SIO2V | 1.56078570 | 105.425 |
| 42 | 252.827890722 | 1.000000000 | N2VP950 | 1.00029966 | 97.727 |
| 43 | 136.184798222 | 47.793960778 | SIO2V | 1.56078570 | 87.092 |
| 44 | 291.218349738 | 8.959947251 | N2VP950 | 1.00029966 | 67.069 |
| 45 | 1284.867832510AS | 36.652815450 | SIO2V | 1.56078570 | 62.759 |
| 46 | 1021.772390757 | 3.210870937 | N2VP950 | 1.00029966 | 38.108 |
| 47 | 0.000000000 | 10.000000000 | SIO2V | 1.56078570 | 33.939 |
| 48 | 0.000000000 | 8.000000000 | LUFTV193 | 1.00030168 | 27.360 |
| 49 | 0.000000000 | 0.000000000 | | 1.00000000 | 14.020 |

ASPHERIC CONSTANTS

SURFACE NR. 2

| | |
|---|---|
| K | 0.0000 |
| C1 | 1.67561866e−007 |
| C2 | −2.12938922e−011 |
| C3 | 1.69680309e−015 |
| C4 | −1.98132595e−019 |
| C5 | 7.57848219e−024 |
| C6 | −1.91694592e−028 |
| C7 | 7.31348529e−034 |
| C8 | 0.00000000e+000 |
| C9 | 0.00000000e+000 |

SURFACE NR. 4

| | |
|---|---|
| K | 0.0000 |
| C1 | −7.60044675e−008 |
| C2 | 1.17354453e−011 |
| C3 | −1.30436139e−015 |
| C4 | 1.52774359e−019 |
| C5 | −6.11275102e−024 |
| C6 | 2.17798015e−028 |
| C7 | −4.32254321e−033 |
| C8 | 0.00000000e+000 |
| C9 | 0.00000000e+000 |

SURFACE NR. 10

| | |
|---|---|
| K | 0.0000 |
| C1 | −1.34208180e−009 |
| C2 | 2.87384909e−013 |
| C3 | −2.97929643e−018 |
| C4 | −1.89342955e−022 |
| C5 | −5.11583717e−027 |
| C6 | 1.55819935e−031 |
| C7 | −1.40446770e−038 |
| C8 | 0.00000000e+000 |
| C9 | 0.00000000e+000 |

SURFACE NR. 21

| | |
|---|---|
| K | 0.0000 |
| C1 | 1.83877356e−008 |
| C2 | 2.86899242e−012 |
| C3 | 3.19518028e−017 |
| C4 | −7.19052986e−020 |
| C5 | 1.13466451e−023 |
| C6 | −1.77192399e−027 |
| C7 | −1.01670692e−031 |
| C8 | 0.00000000e+000 |
| C9 | 0.00000000e+000 |

SURFACE NR. 26

| | |
|---|---|
| K | 0.0000 |
| C1 | −1.01472536e−008 |
| C2 | 1.33731219e−012 |
| C3 | −5.43150945e−018 |
| C4 | 4.71557114e−023 |
| C5 | −6.64341291e−026 |

TABLE 5-continued

| | | |
|---|---|---|
| | C6 | −3.91519696e−031 |
| | C7 | 6.16634038e−035 |
| | C8 | 0.00000000e+000 |
| | C9 | 0.00000000e+000 |
| | SURFACE NR. 33 | |
| | K | 0.0000 |
| | C1 | 2.13285827e−009 |
| | C2 | −5.84623813e−014 |
| | C3 | −1.42317238e−018 |
| | C4 | 1.10894118e−023 |
| | C5 | −1.75615181e−027 |
| | C6 | 1.54014495e−031 |
| | C7 | −3.58350869e−036 |
| | C8 | 0.00000000e+000 |
| | C9 | 0.00000000e+000 |
| | SURFACE NR. 38 | |
| | K | 0.0000 |
| | C1 | −4.16611922e−009 |
| | C2 | 4.28615353e−014 |
| | C3 | −6.79159744e−019 |
| | C4 | −2.60455674e−023 |
| | C5 | 1.06709496e−027 |
| | C6 | −7.04980983e−032 |
| | C7 | 3.97315562e−037 |
| | C8 | 0.00000000e+000 |
| | C9 | 0.00000000e+000 |
| | SURFACE NR. 45 | |
| | K | 0.0000 |
| | C1 | −1.10987995e−008 |
| | C2 | 6.74554563e−012 |
| | C3 | −6.08182492e−016 |
| | C4 | 2.40267725e−020 |
| | C5 | −2.12867221e−024 |
| | C6 | 6.08391245e−028 |
| | C7 | −5.81691443e−032 |
| | C8 | 0.00000000e+000 |
| | C9 | 0.00000000e+000 |

TABLE 6

| SURFACE | RADIUS | THICKNESS | GLASSES | REFRACTIVE INDEX 193.304 nm | ½ FREE DIAMETER |
|---|---|---|---|---|---|
| 0 | 0.000000000 | 31.000000000 | L710 | 0.99998200 | 56.080 |
| 1 | 0.000000000 | 1.000000000 | HE193 | 0.99971200 | 62.856 |
| 2 | 324.818247939AS | 8.109025357 | SIO2HL | 1.56028895 | 64.646 |
| 3 | 219.117611826 | 5.509660348 | HE193 | 0.99971200 | 65.135 |
| 4 | 289.200300616AS | 7.000000000 | SIO2HL | 1.56028895 | 66.381 |
| 5 | 227.856104705 | 17.243048254 | HE193 | 0.99971200 | 66.734 |
| 6 | −377.649070374 | 7.000000000 | SIO2HL | 1.56028895 | 67.059 |
| 7 | 387.641770903 | 30.796463985 | HE193 | 0.99971200 | 71.597 |
| 8 | −125.714248975 | 54.975207900 | SIO2HL | 1.56028895 | 72.277 |
| 9 | −176.955529980 | 1.000000000 | HE193 | 0.99971200 | 100.007 |
| 10 | −1297.534896140 | 31.636302227 | SIO2HL | 1.56028895 | 114.600 |
| 11 | −320.961128376 | 1.000000000 | HE193 | 0.99971200 | 119.511 |
| 12 | 936.880173082 | 44.820142873 | SIO2HL | 1.56028895 | 130.745 |
| 13 | −328.618771838 | 3.088384233 | HE193 | 0.99971200 | 131.968 |
| 14 | 317.146646669 | 32.169396486 | SIO2HL | 1.56028895 | 131.861 |
| 15 | 1880.972057190 | 78.800003484 | HE193 | 0.99971200 | 130.569 |
| 16 | 778.616134901 | 21.855706412 | SIO2HL | 1.56028895 | 112.867 |
| 17 | −1344.892951770 | 2.120584882 | HE193 | 0.99971200 | 111.151 |
| 18 | 184.194583638 | 26.864832492 | SIO2HL | 1.56028895 | 98.404 |
| 19 | 117.923993472 | 8.944323916 | HE193 | 0.99971200 | 83.450 |
| 20 | 122.599592610 | 50.092138884 | SIO2HL | 1.56028895 | 82.216 |
| 21 | 123.591716800 | 52.677842672 | HE193 | 0.99971200 | 66.129 |
| 22 | −133.413687632 | 7.000000000 | SIO2HL | 1.56028895 | 59.894 |
| 23 | 201.636820203 | 31.091699285 | HE193 | 0.99971200 | 59.866 |
| 24 | −117.122170355 | 22.371886041 | SIO2HL | 1.56028895 | 60.770 |
| 25 | 271.237822926 | 18.190270939 | HE193 | 0.99971200 | 77.184 |
| 26 | −828.307583707 | 23.724292231 | SIO2HL | 1.56028895 | 80.324 |
| 27 | −217.730531706 | 1.629365175 | HE193 | 0.99971200 | 86.028 |
| 28 | 24863.715253700 | 23.891029762 | SIO2HL | 1.56028895 | 99.050 |

TABLE 6-continued

| | | | | | |
|---|---|---|---|---|---|
| 29 | −340.154546232 | 1.000000000 | HE193 | 0.99971200 | 102.080 |
| 30 | 499.177180862 | 33.230036742 | SIO2HL | 1.56028895 | 114.528 |
| 31 | −613.861853920 | 4.746303203 | HE193 | 0.99971200 | 115.894 |
| 32 | −515.657687359AS | 7.000000000 | SIO2HL | 1.56028895 | 116.027 |
| 33 | −2799.133265700 | 28.850953586 | HE193 | 0.99971200 | 119.520 |
| 34 | −374.801866679 | 25.903304270 | SIO2HL | 1.56028895 | 122.380 |
| 35 | −229.064488423 | 3.130798012 | HE193 | 0.99971200 | 125.091 |
| 36 | 0.000000000 | 4.590309473 | HE193 | 0.99971200 | 129.531 |
| 37 | 0.000000000 | −1.761443244 | HE193 | 0.99971200 | 129.976 |
| 38 | 480.603781326 | 23.812586743 | SIO2HL | 1.56028895 | 134.088 |
| 39 | 259.375898088 | 8.237844188 | HE193 | 0.99971200 | 135.910 |
| 40 | 312.231631384 | 55.513942588 | SIO2HL | 1.56028895 | 136.609 |
| 41 | −596.581070286 | 4.943886708 | HE193 | 0.99971200 | 137.420 |
| 42 | 371.538894387 | 38.328387113 | SIO2HL | 1.56028895 | 138.683 |
| 43 | −20570.555487000AS | 2.057897803 | HE193 | 0.99971200 | 137.171 |
| 44 | 186.804638892 | 55.000000000 | SIO2HL | 1.56028895 | 127.714 |
| 45 | 371.539070225 | 13.149085685 | HE193 | 0.99971200 | 117.755 |
| 46 | 136.294111489 | 54.999981718 | SIO2HL | 1.56028895 | 99.988 |
| 47 | 527.773767013AS | 1.000000000 | HE193 | 0.99971200 | 86.981 |
| 48 | 170.379719961 | 35.449588232 | SIO2HL | 1.56028895 | 76.078 |
| 49 | 292.013444451AS | 7.226713258 | HE193 | 0.99971200 | 57.583 |
| 50 | 0.000000000 | 27.238216082 | CAF2HL | 1.50143563 | 54.452 |
| 51 | 0.000000000 | 1.500000000 | HE193 | 0.99971200 | 35.406 |
| 52 | 0.000000000 | 10.000000000 | SIO2HL | 1.56028895 | 32.871 |
| 53 | 0.000000000 | 7.250000000 | L710 | 0.99998200 | 26.261 |
| 54 | 0.000000000 | 0.000000000 | | 1.00000000 | 14.020 |

ASPHERIC CONSTANTS

SURFACE NR. 2

| | |
|---|---|
| K | −1.8845 |
| C1 | 5.29821153e−008 |
| C2 | −4.43279002e−012 |
| C3 | 1.28707472e−015 |
| C4 | −2.39343289e−019 |
| C5 | 1.99234178e−023 |
| C6 | 2.46399483e−027 |
| C7 | −4.33709316e−031 |
| C8 | 0.00000000e+000 |
| C9 | 0.00000000e+000 |

SURFACE NR. 4

| | |
|---|---|
| K | 0.1824 |
| C1 | 7.99717816e−008 |
| C2 | 3.44235754e−013 |
| C3 | −1.08433322e−015 |
| C4 | 2.49428499e−019 |
| C5 | −4.04263889e−023 |
| C6 | 2.92251162e−027 |
| C7 | −2.35276355e−032 |
| C8 | 0.00000000e+000 |
| C9 | 0.00000000e+000 |

SURFACE NR. 32

| | |
|---|---|
| K | 0.0000 |
| C1 | −1.27754362e−008 |
| C2 | 3.02764844e−013 |
| C3 | 1.00750526e−018 |
| C4 | −6.13679336e−023 |
| C5 | 4.38665224e−027 |
| C6 | −3.40250286e−031 |
| C7 | 1.46968938e−035 |
| C8 | 0.00000000e+000 |
| C9 | 0.00000000e+000 |

SURFACE NR. 43

| | |
|---|---|
| K | 0.0000 |
| C1 | 1.57685663e−009 |
| C2 | 1.02156359e−013 |
| C3 | −1.70007813e−018 |
| C4 | −2.26737767e−023 |
| C5 | 2.28492082e−027 |
| C6 | −1.04091200e−031 |
| C7 | 2.34019985e−036 |
| C8 | 0.00000000e+000 |
| C9 | 0.00000000e+000 |

TABLE 6-continued

SURFACE NR. 47

| | |
|---|---|
| K | 6.8784 |
| C1 | 1.53142434e−008 |
| C2 | −3.32257012e−013 |
| C3 | 8.40396973e−017 |
| C4 | −1.22248965e−020 |
| C5 | 1.29284065e−024 |
| C6 | −8.69096802e−029 |
| C7 | 1.99745782e−033 |
| C8 | 0.00000000e+000 |
| C9 | 0.00000000e+000 |

SURFACE NR. 49

| | |
|---|---|
| K | 0.0000 |
| C1 | −2.17885424e−008 |
| C2 | −4.43299434e−013 |
| C3 | −1.44194471e−015 |
| C4 | 2.99216702e−019 |
| C5 | −8.06687258e−023 |
| C6 | 1.77963946e−026 |
| C7 | −1.41052000e−030 |
| C8 | 0.00000000e+000 |
| C9 | 0.00000000e+000 |

TABLE 6a

| Surface | SINImax | Imax [deg] |
|---|---|---|
| 0 | | |
| 1 | 0.219 | 12.65 |
| 2 | 0.4466 | 26.53 |
| 3 | 0.5367 | 32.46 |
| 4 | 0.5376 | 32.52 |
| 5 | 0.5296 | 31.98 |
| 6 | 0.2882 | 16.75 |
| 7 | 0.6327 | 39.25 |
| 8 | 0.3718 | 21.83 |
| 9 | 0.267 | 15.49 |
| 10 | 0.4034 | 23.79 |
| 11 | 0.2126 | 12.27 |
| 12 | 0.4555 | 27.10 |
| 13 | 0.4051 | 23.90 |
| 14 | 0.4202 | 24.85 |
| 15 | 0.2164 | 12.50 |
| 16 | 0.2138 | 12.35 |
| 17 | 0.42 | 24.83 |
| 18 | 0.2187 | 12.63 |
| 19 | 0.5589 | 33.98 |
| 20 | 0.5152 | 31.01 |
| 21 | 0.3269 | 19.08 |
| 22 | 0.7092 | 45.17 |
| 23 | 0.5457 | 33.07 |
| 24 | 0.3583 | 21.00 |
| 25 | 0.9082 | 65.26 |
| 26 | 0.7085 | 45.11 |
| 27 | 0.3348 | 19.56 |
| 28 | 0.6244 | 38.64 |
| 29 | 0.2345 | 13.56 |
| 30 | 0.6387 | 39.69 |
| 31 | 0.0877 | 5.03 |
| 32 | 0.1301 | 7.48 |

TABLE 6a-continued

| Surface | SINImax | Imax [deg] |
|---|---|---|
| 33 | 0.323 | 18.84 |
| 34 | 0.0718 | 4.12 |
| 35 | 0.4628 | 27.57 |
| 36 | 0.2345 | 13.56 |
| 37 | 0.2345 | 13.56 |
| 38 | 0.4873 | 29.16 |
| 39 | 0.8491 | 58.11 |
| 40 | 0.7965 | 52.80 |
| 41 | 0.328 | 19.15 |
| 42 | 0.3866 | 22.74 |
| 43 | 0.274 | 15.90 |
| 44 | 0.5254 | 31.70 |
| 45 | 0.2422 | 14.02 |
| 46 | 0.3632 | 21.30 |
| 47 | 0.6501 | 40.55 |
| 48 | 0.4858 | 29.06 |
| 49 | 0.8107 | 54.16 |
| 50 | 0.8759 | 61.15 |
| 51 | 0.8759 | 61.15 |
| 52 | 0.8759 | 61.15 |
| 53 | 0.8759 | 61.15 |
| 54 | 0.8759 | 61.15 |

TABLE 7

| SURFACE | RADIUS | THICKNESS | GLASSES | REFRACTIVE INDEX 193.304 nm | ½ FREE DIAMETER |
|---|---|---|---|---|---|
| 0 | 0.000000000 | 31.000000000 | L710 | 0.99998200 | 56.080 |
| 1 | 0.000000000 | 1.000000000 | HE193 | 0.99971200 | 62.856 |
| 2 | 324.818247939AS | 8.109025357 | SIO2HL | 1.56028895 | 64.646 |
| 3 | 219.117611826 | 5.508087220 | HE193 | 0.99971200 | 65.135 |

TABLE 7-continued

| | | | | | |
|---|---|---|---|---|---|
| 4 | 289.200300616AS | 7.000000000 | SIO2HL | 1.56028895 | 66.381 |
| 5 | 227.856104705 | 17.243070148 | HE193 | 0.99971200 | 66.734 |
| 6 | −377.649070374 | 7.000000000 | SIO2HL | 1.56028895 | 67.059 |
| 7 | 387.641770903 | 30.765544016 | HE193 | 0.99971200 | 71.598 |
| 8 | −125.714248975 | 54.975207900 | SIO2HL | 1.56028895 | 72.265 |
| 9 | −176.955529980 | 1.000000000 | HE193 | 0.99971200 | 99.993 |
| 10 | −1297.534896140 | 31.636302227 | SIO2HL | 1.56028895 | 114.582 |
| 11 | −320.961128376 | 1.000000000 | HE193 | 0.99971200 | 119.494 |
| 12 | 936.880173082 | 44.820142873 | SIO2HL | 1.56028895 | 130.726 |
| 13 | −328.618771838 | 3.492277374 | HE193 | 0.99971200 | 131.951 |
| 14 | 317.146646669 | 32.169396486 | SIO2HL | 1.56028895 | 131.848 |
| 15 | 1880.972057190 | 78.466159550 | HE193 | 0.99971200 | 130.555 |
| 16 | 778.616134901 | 21.855706412 | SIO2HL | 1.56028895 | 112.930 |
| 17 | −1344.892951770 | 1.631223556 | HE193 | 0.99971200 | 111.218 |
| 18 | 184.194583638 | 26.864832492 | SIO2HL | 1.56028895 | 98.601 |
| 19 | 117.923993472 | 8.738538132 | HE193 | 0.99971200 | 83.612 |
| 20 | 122.599592610 | 50.092138884 | SIO2HL | 1.56028895 | 82.419 |
| 21 | 123.591716800 | 53.386697866 | HE193 | 0.99971200 | 66.332 |
| 22 | −133.413687632 | 7.000000000 | SIO2HL | 1.56028895 | 59.919 |
| 23 | 201.636820203 | 31.123951016 | HE193 | 0.99971200 | 59.900 |
| 24 | −117.122170355 | 22.371886041 | SIO2HL | 1.56028895 | 60.806 |
| 25 | 271.237822926 | 18.548517752 | HE193 | 0.99971200 | 77.260 |
| 26 | −828.307583707 | 23.724292231 | SIO2HL | 1.56028895 | 80.717 |
| 27 | −217.730531706 | 1.000000000 | HE193 | 0.99971200 | 86.373 |
| 28 | 24863.715253700 | 23.891029762 | SIO2HL | 1.56028895 | 99.099 |
| 29 | −340.154546232 | 1.000000000 | HE193 | 0.99971200 | 102.128 |
| 30 | 499.177180862 | 33.230036742 | SIO2HL | 1.56028895 | 114.615 |
| 31 | −613.861853920 | 4.746303203 | HE193 | 0.99971200 | 115.978 |
| 32 | −515.657687359AS | 7.000000000 | SIO2HL | 1.56028895 | 116.111 |
| 33 | −2799.133265700 | 28.850953586 | HE193 | 0.99971200 | 119.614 |
| 34 | −374.801866679 | 25.903304270 | SIO2HL | 1.56028895 | 122.472 |
| 35 | −229.064488423 | 3.130798012 | HE193 | 0.99971200 | 125.181 |
| 36 | 0.000000000 | 5.173121288 | SIO2HL | 1.56028895 | 129.642 |
| 37 | 0.000000000 | 1.000000000 | HE193 | 0.99971200 | 130.135 |
| 38 | 474.346153969 | 24.214285976 | SIO2HL | 1.56028895 | 134.997 |
| 39 | 257.158432536 | 8.053951335 | HE193 | 0.99971200 | 136.742 |
| 40 | 306.376423539 | 57.804293441 | SIO2HL | 1.56028895 | 137.456 |
| 41 | −562.895510400 | 1.000000000 | HE193 | 0.99971200 | 138.239 |
| 42 | 372.293287787 | 33.212051475 | SIO2HL | 1.56028895 | 138.770 |
| 43 | 12328.532325400AS | 1.106587587 | HE193 | 0.99971200 | 137.675 |
| 44 | 193.144605329 | 54.576878288 | SIO2HL | 1.56028895 | 128.685 |
| 45 | 379.786426378 | 16.773776607 | HE193 | 0.99971200 | 118.623 |
| 46 | 134.855937913 | 55.000000000 | SIO2HL | 1.56028895 | 99.496 |
| 47 | 536.515306116AS | 1.080464261 | HE193 | 0.99971200 | 86.795 |
| 48 | 173.206435013 | 35.323967088 | SIO2HL | 1.56028895 | 76.056 |
| 49 | 299.060830919AS | 6.563458346 | HE193 | 0.99971200 | 57.738 |
| 50 | 0.000000000 | 28.341741198 | SIO2HL | 1.56028895 | 55.402 |
| 51 | 0.000000000 | 1.500000000 | HE193 | 0.99971200 | 36.669 |
| 52 | 0.000000000 | 10.000000000 | SIO2HL | 1.56028895 | 34.134 |
| 53 | 0.000000000 | 7.999999986 | L710 | 0.99998200 | 27.525 |
| 54 | 0.000000000 | 0.000000000 | | 1.00000000 | 14.020 |

ASPHERIC CONSTANTS

SURFACE NR. 2

| | |
|---|---|
| K | −1.8845 |
| C1 | 5.29821153e−008 |
| C2 | −4.43279002e−012 |
| C3 | 1.28707472e−015 |
| C4 | −2.39343289e−019 |
| C5 | 1.99234178e−023 |
| C6 | 2.46399483e−027 |
| C7 | −4.33709316e−031 |
| C8 | 0.00000000e+000 |
| C9 | 0.00000000e+000 |

SURFACE NR. 4

| | |
|---|---|
| K | 0.1824 |
| C1 | 7.99717816e−008 |
| C2 | 3.44235754e−013 |
| C3 | −1.08433322e−015 |
| C4 | 2.49428499e−019 |
| C5 | −4.04263889e−023 |
| C6 | 2.92251162e−027 |
| C7 | −2.35276355e−032 |
| C8 | 0.00000000e+000 |
| C9 | 0.00000000e+000 |

TABLE 7-continued

SURFACE NR. 32

| | |
|---|---|
| K | 0.0000 |
| C1 | −1.27754362e−008 |
| C2 | 3.02764844e−013 |
| C3 | 1.00750526e−018 |
| C4 | −6.13679336e−023 |
| C5 | 4.38665224e−027 |
| C6 | −3.40250286e−031 |
| C7 | 1.46968938e−035 |
| C8 | 0.00000000e+000 |
| C9 | 0.00000000e+000 |

SURFACE NR. 43

| | |
|---|---|
| K | 0.0000 |
| C1 | 1.36549730e−009 |
| C2 | 1.02306815e−013 |
| C3 | −1.35739896e−018 |
| C4 | −1.99345093e−023 |
| C5 | 1.59224599e−027 |
| C6 | −6.75882258e−032 |
| C7 | 1.39559460e−036 |
| C8 | 0.00000000e+000 |
| C9 | 0.00000000e+000 |

SURFACE NR. 47

| | |
|---|---|
| K | 7.2953 |
| C1 | 1.61057750e−008 |
| C2 | −5.05815963e−013 |
| C3 | 8.84032736e−017 |
| C4 | −1.11981147e−020 |
| C5 | 1.14085256e−024 |
| C6 | −7.43387672e−029 |
| C7 | 1.41113763e−033 |
| C8 | 0.00000000e+000 |
| C9 | 0.00000000e+000 |

SURFACE NR. 49

| | |
|---|---|
| K | 0.0000 |
| C1 | −3.00219975e−008 |
| C2 | −1.20927625e−013 |
| C3 | −1.49865939e−015 |
| C4 | 3.27847128e−019 |
| C5 | −9.19939235e−023 |
| C6 | 2.08807060e−026 |
| C7 | −1.71435366e−030 |
| C8 | 0.00000000e+000 |
| C9 | 0.00000000e+000 |

TABLE 7a

| Surface | SINImax | Imax [deg] |
|---|---|---|
| 0 | | |
| 1 | 0.219 | 12.65 |
| 2 | 0.4466 | 26.53 |
| 3 | 0.5367 | 32.46 |
| 4 | 0.5376 | 32.52 |
| 5 | 0.5296 | 31.98 |
| 6 | 0.2882 | 16.75 |
| 7 | 0.6327 | 39.25 |
| 8 | 0.3718 | 21.83 |
| 9 | 0.267 | 15.49 |
| 10 | 0.4034 | 23.79 |
| 11 | 0.2126 | 12.27 |
| 12 | 0.4555 | 27.10 |
| 13 | 0.405 | 23.89 |
| 14 | 0.4202 | 24.85 |
| 15 | 0.2164 | 12.50 |
| 16 | 0.2137 | 12.34 |
| 17 | 0.4201 | 24.84 |
| 18 | 0.22 | 12.71 |
| 19 | 0.561 | 34.12 |
| 20 | 0.5177 | 31.18 |
| 21 | 0.3253 | 18.98 |
| 22 | 0.7092 | 45.17 |
| 23 | 0.5458 | 33.08 |
| 24 | 0.3582 | 20.99 |
| 25 | 0.9092 | 65.40 |
| 26 | 0.7085 | 45.11 |
| 27 | 0.3328 | 19.44 |
| 28 | 0.6241 | 38.62 |
| 29 | 0.2343 | 13.55 |
| 30 | 0.6385 | 39.68 |
| 31 | 0.0876 | 5.03 |
| 32 | 0.1299 | 7.46 |
| 33 | 0.3229 | 18.84 |
| 34 | 0.0715 | 4.10 |
| 35 | 0.463 | 27.58 |
| 36 | 0.2344 | 13.56 |
| 37 | 0.2344 | 13.56 |
| 38 | 0.4921 | 29.48 |
| 39 | 0.8574 | 59.03 |
| 40 | 0.8079 | 53.89 |
| 41 | 0.3555 | 20.82 |
| 42 | 0.373 | 21.90 |
| 43 | 0.2616 | 15.17 |

TABLE 7a-continued

| Surface | SINImax | Imax [deg] |
|---|---|---|
| 44 | 0.503 | 30.20 |
| 45 | 0.2398 | 13.87 |
| 46 | 0.377 | 22.15 |
| 47 | 0.6524 | 40.72 |
| 48 | 0.492 | 29.47 |
| 49 | 0.8135 | 54.44 |
| 50 | 0.876 | 61.16 |

TABLE 7a-continued

| Surface | SINImax | Imax [deg] |
|---|---|---|
| 51 | 0.876 | 61.16 |
| 52 | 0.876 | 61.16 |
| 53 | 0.876 | 61.16 |
| 54 | 0.876 | 61.16 |

TABLE 8

| SURFACE | RADIUS | THICKNESS | GLASSES | REFRACTIVE INDEX 193.304 nm | ½ FREE DIAMETER |
|---|---|---|---|---|---|
| 0 | 0.000000000 | 34.598670703 | LUFTV193 | 1.00030168 | 56.080 |
| 1 | 0.000000000 | 5.480144837 | LUFTV193 | 1.00030168 | 64.122 |
| 2 | 6478.659586000AS | 10.843585909 | SIO2V | 1.56078570 | 65.807 |
| 3 | −1354.203087320 | 2.423172128 | N2VP950 | 1.00029966 | 66.705 |
| 4 | −1087.803716660 | 9.621961389 | SIO2V | 1.56078570 | 67.029 |
| 5 | 183.366808766 | 2.746190506 | N2VP950 | 1.00029966 | 70.249 |
| 6 | 206.367008633AS | 8.085673658 | SIO2V | 1.56078570 | 71.462 |
| 7 | 193.387116101 | 36.794320510 | N2VP950 | 1.00029966 | 72.483 |
| 8 | −140.799169619 | 50.095071588 | SIO2V | 1.56078570 | 73.484 |
| 9 | −373.463518266 | 1.000056376 | N2VP950 | 1.00029966 | 103.736 |
| 10 | −561.452806488 | 22.561578822 | SIO2V | 1.56078570 | 107.508 |
| 11 | −263.612680429 | 1.000756794 | N2VP950 | 1.00029966 | 111.562 |
| 12 | −49392.564837400 | 53.841314203 | SIO2V | 1.56078570 | 124.515 |
| 13 | −266.359005048 | 15.247580669 | N2VP950 | 1.00029966 | 130.728 |
| 14 | 840.618794866 | 29.011390428 | SIO2V | 1.56078570 | 141.616 |
| 15 | −926.722502535 | 1.005611320 | N2VP950 | 1.00029966 | 142.120 |
| 16 | 2732.904696180 | 38.725041529 | SIO2V | 1.56078570 | 141.999 |
| 17 | −356.203262494AS | 2.005496104 | N2VP950 | 1.00029966 | 141.858 |
| 18 | 318.151930355 | 16.617316424 | SIO2V | 1.56078570 | 124.740 |
| 19 | 513.819497301 | 1.562497532 | N2VP950 | 1.00029966 | 122.663 |
| 20 | 171.455700974 | 30.277693574 | SIO2V | 1.56078570 | 111.385 |
| 21 | 154.841382726 | 1.064445848 | N2VP950 | 1.00029966 | 98.077 |
| 22 | 127.756841801 | 43.191494812 | SIO2V | 1.56078570 | 94.695 |
| 23 | 104.271940246 | 52.476004091 | N2VP950 | 1.00029966 | 74.378 |
| 24 | −283.692700248 | 8.000000007 | SIO2V | 1.56078570 | 68.565 |
| 25 | 242.925344027 | 39.949819872 | N2VP950 | 1.00029966 | 64.404 |
| 26 | −117.414778719 | 8.181191942 | SIO2V | 1.56078570 | 63.037 |
| 27 | 197.144513187 | 26.431530314 | N2VP950 | 1.00029966 | 69.190 |
| 28 | −244.477949570 | 44.225451360 | SIO2V | 1.56078570 | 71.085 |
| 29 | −230.356430065 | 1.409104251 | N2VP950 | 1.00029966 | 88.427 |
| 30 | 1472.096760620AS | 21.137736519 | SIO2V | 1.56078570 | 99.340 |
| 31 | −450.715283484 | 1.259333876 | N2VP950 | 1.00029966 | 101.126 |
| 32 | 3573.378947270 | 8.391191259 | SIO2V | 1.56078570 | 105.206 |
| 33 | 7695.066698120 | 1.258010005 | N2VP950 | 1.00029966 | 106.474 |
| 34 | 1029.326174920 | 8.390466230 | SIO2V | 1.56078570 | 108.186 |
| 35 | 243.058844043 | 29.823514356 | N2VP950 | 1.00029966 | 112.152 |
| 36 | 29057.985214100 | 38.911793339 | SIO2V | 1.56078570 | 114.058 |
| 37 | −232.205630821 | 1.000000003 | N2VP950 | 1.00029966 | 116.928 |
| 38 | 270.144711058 | 55.850950401 | SIO2V | 1.56078570 | 139.162 |
| 39 | 1183.955771760AS | 20.935175304 | N2VP950 | 1.00029966 | 138.048 |
| 40 | 0.000000000 | −2.958030543 | N2VP950 | 1.00029966 | 138.244 |
| 41 | 368.838236812 | 22.472409726 | SIO2V | 1.56078570 | 141.049 |
| 42 | 220.058626892 | 26.974361640 | N2VP950 | 1.00029966 | 137.707 |
| 43 | 355.728536436 | 58.022036072 | SIO2V | 1.56078570 | 140.923 |
| 44 | −861.478061183AS | 4.104303800 | N2VP950 | 1.00029966 | 142.103 |
| 45 | 420.713002153 | 55.049896341 | SIO2V | 1.56078570 | 142.502 |
| 46 | −478.998238339 | 1.000000000 | N2VP950 | 1.00029966 | 141.431 |
| 47 | 122.579574949 | 48.569396230 | SIO2V | 1.56078570 | 106.623 |
| 48 | 223.612364366AS | 1.000000000 | N2VP950 | 1.00029966 | 99.428 |
| 49 | 132.028746911 | 49.487311459 | SIO2V | 1.56078570 | 88.176 |
| 50 | 247.223694320 | 10.595001724 | N2VP950 | 1.00029966 | 65.249 |
| 51 | 712.954951376AS | 8.355490390 | SIO2V | 1.56078570 | 57.430 |
| 52 | 163.735058824 | 3.094306970 | N2VP950 | 1.00029966 | 47.446 |
| 53 | 154.368612651 | 19.294967287 | SIO2V | 1.56078570 | 44.361 |
| 54 | 677.158668491 | 2.851896407 | N2VP950 | 1.00029966 | 33.956 |
| 55 | 0.000000000 | 10.000000000 | SIO2V | 1.56078570 | 29.666 |
| 56 | 0.000000000 | 4.000000000 | LUFTV193 | 1.00030168 | 22.559 |
| 57 | 0.000000000 | 0.000000000 | | 1.00000000 | 14.020 |

TABLE 8-continued

| ASPHERIC CONSTANTS | |
|---|---|
| SURFACE NR. 2 | |
| K | 0.0000 |
| C1 | 1.38277367e−007 |
| C2 | −1.88982133e−011 |
| C3 | 1.94899866e−015 |
| C4 | −3.04512613e−019 |
| C5 | 3.31424645e−023 |
| C6 | −2.70316185e−027 |
| C7 | 1.30470314e−031 |
| C8 | 0.00000000e+000 |
| C9 | 0.00000000e+000 |
| SURFACE NR. 6 | |
| K | 0.0000 |
| C1 | −1.02654080e−008 |
| C2 | 1.22477004e−011 |
| C3 | −1.70638250e−015 |
| C4 | 2.48526394e−019 |
| C5 | −2.38582445e−023 |
| C6 | 1.51451580e−027 |
| C7 | −6.30610228e−032 |
| C8 | 0.00000000e+000 |
| C9 | 0.00000000e+000 |
| SURFACE NR. 12 | |
| K | 0.0000 |
| C1 | −3.36870323e−009 |
| C2 | 1.77350477e−013 |
| C3 | 1.19052376e−019 |
| C4 | −1.17127296e−022 |
| C5 | −9.25382522e−027 |
| C6 | 4.88058037e−031 |
| C7 | −1.32782815e−035 |
| C8 | 0.00000000e+000 |
| C9 | 0.00000000e+000 |
| SURFACE NR. 17 | |
| K | 0.0000 |
| C1 | 2.29017476e−010 |
| C2 | 4.92394931e−014 |
| C3 | 2.34180010e−019 |
| C4 | −2.74433865e−023 |
| C5 | 8.02938234e−029 |
| C6 | −1.05282366e−032 |
| C7 | −1.44319713e−038 |
| C8 | 0.00000000e+000 |
| C9 | 0.00000000e+000 |
| SURFACE NR. 30 | |
| K | 0.0000 |
| C1 | −1.51349530e−008 |
| C2 | 9.73999326e−013 |
| C3 | 8.62745113e−018 |
| C4 | 5.94720340e−022 |
| C5 | −4.71903409e−026 |
| C6 | 2.87654316e−031 |
| C7 | 4.40822786e−035 |
| C8 | 0.00000000e+000 |
| C9 | 0.00000000e+000 |
| SURFACE NR. 39 | |
| K | 0.0000 |
| C1 | 5.16807805e−009 |
| C2 | −6.52986543e−014 |
| C3 | −6.91577796e−019 |
| C4 | −3.61532300e−024 |
| C5 | −1.38222518e−027 |
| C6 | 1.06689880e−031 |
| C7 | −1.65303231e−036 |
| C8 | 0.00000000e+000 |
| C9 | 0.00000000e+000 |
| SURFACE NR. 44 | |
| K | 0.0000 |
| C1 | −3.74086200e−009 |
| C2 | 9.09495287e−014 |

TABLE 8-continued

| | | |
|---|---|---|
| | C3 | −9.58269360e−019 |
| | C4 | 2.46215375e−023 |
| | C5 | −8.23397865e−028 |
| | C6 | 1.33400957e−032 |
| | C7 | −5.95002910e−037 |
| | C8 | 0.00000000e+000 |
| | C9 | 0.00000000e+000 |
| | SURFACE NR. 48 | |
| | K | 0.0000 |
| | C1 | −2.07951112e−009 |
| | C2 | −3.24793684e−014 |
| | C3 | −4.06763809e−018 |
| | C4 | −4.85274422e−022 |
| | C5 | 2.39376432e−027 |
| | C6 | 2.44680800e−030 |
| | C7 | −5.62502628e−035 |
| | C8 | 0.00000000e+000 |
| | C9 | 0.00000000e+000 |
| | SURFACE NR. 51 | |
| | K | 0.0000 |
| | C1 | −6.57065732e−009 |
| | C2 | 2.35659016e−012 |
| | C3 | −1.23585829e−016 |
| | C4 | 5.34294269e−020 |
| | C5 | −1.12897797e−023 |
| | C6 | 1.37710849e−027 |
| | C7 | −1.15055048e−031 |
| | C8 | 0.00000000e+000 |
| | C9 | 0.00000000e+000 |

TABLE 8a

| Surface | SINImax | Imax [deg] |
|---|---|---|
| 0 | | |
| 1 | 0.2265 | 13.09 |
| 2 | 0.2921 | 16.98 |
| 3 | 0.3021 | 17.58 |
| 4 | 0.3093 | 18.02 |
| 5 | 0.7727 | 50.60 |
| 6 | 0.7815 | 51.40 |
| 7 | 0.7503 | 48.62 |
| 8 | 0.3748 | 22.01 |
| 9 | 0.3301 | 19.27 |
| 10 | 0.4126 | 24.37 |
| 11 | 0.2102 | 12.13 |
| 12 | 0.4461 | 26.49 |
| 13 | 0.3287 | 19.19 |
| 14 | 0.3408 | 19.93 |
| 15 | 0.2163 | 12.49 |
| 16 | 0.1724 | 9.93 |
| 17 | 0.6379 | 39.64 |
| 18 | 0.1545 | 8.89 |
| 19 | 0.21 | 12.12 |
| 20 | 0.3165 | 18.45 |
| 21 | 0.284 | 16.50 |
| 22 | 0.4232 | 25.04 |
| 23 | 0.3618 | 21.21 |
| 24 | 0.6198 | 38.30 |
| 25 | 0.4029 | 23.76 |
| 26 | 0.6229 | 38.53 |
| 27 | 0.7684 | 50.21 |
| 28 | 0.4293 | 25.42 |
| 29 | 0.2783 | 16.16 |
| 30 | 0.5705 | 34.79 |
| 31 | 0.2529 | 14.65 |
| 32 | 0.4358 | 25.84 |
| 33 | 0.4179 | 24.70 |
| 34 | 0.4824 | 28.84 |
| 35 | 0.8986 | 63.97 |
| 36 | 0.6723 | 42.24 |
| 37 | 0.2232 | 12.90 |
| 38 | 0.8128 | 54.37 |

TABLE 8a-continued

| Surface | SINImax | Imax [deg] |
|---|---|---|
| 39 | 0.2534 | 14.68 |
| 40 | 0.1112 | 6.38 |
| 41 | 0.4829 | 28.87 |
| 42 | 0.8791 | 61.53 |
| 43 | 0.7207 | 46.11 |
| 44 | 0.2809 | 16.31 |
| 45 | 0.3478 | 20.35 |
| 46 | 0.6869 | 43.39 |
| 47 | 0.6164 | 38.05 |
| 48 | 0.4133 | 24.41 |
| 49 | 0.2042 | 11.78 |
| 50 | 0.7917 | 52.34 |
| 51 | 0.8696 | 60.41 |
| 52 | 0.7273 | 46.66 |
| 53 | 0.7381 | 47.57 |
| 54 | 0.901 | 64.29 |
| 55 | 0.9059 | 64.94 |
| 56 | 0.9059 | 64.94 |
| 57 | 0.9059 | 64.94 |

The invention claimed is:

1. A refractive projection objective for microlithography with a numerical aperture NA greater than 0.7, consisting of:
a first lens group immediately following an object plane of the projection objective and having negative refractive power;
a second lens group immediately following the first lens group and having positive refractive power;
a third lens group immediately following the second lens group and having negative refractive power for generating a constriction of a light beam passing through the projection objective;
a fourth lens group immediately following the third lens group and having positive refractive power; and
a fifth lens group immediately following the fourth lens group and having positive refractive power;

the projection objective thereby consisting of a first convexity, a second convexity, and a waist arranged between the first and second convexity, wherein the first convexity has a maximum diameter denoted by D1, and the second convexity has a maximum diameter denoted by D2, and $0.8 < D_1/D_2 < 1.1$.

2. A refractive projection objective according to claim 1, wherein the following relationship of the maximum diameters holds:

$0.9 < D_1/D_2 < 1.0$.

3. A refractive projection objective according to claim 2, wherein the following relationships holds:

$L \cdot D_{max}/(NA \cdot 2yb) < 12,850$, where L is the constructional length measured from the object plane to the image plane of the projection objective, NA is the image-side numerical aperture, $D_{MAX}$ is the maximum diameter of the system and thus is D1 or D2, and 2 yb is the diameter of the image field.

4. A refractive projection objective according to claim 1, wherein the first lens group has at least two negative lenses.

5. A refractive projection objective according to claim 1, wherein an etendue value of the projection objective is greater than 2% of the constructional length, the etendue value being defined as the product of the image field diameter and the image-side numerical aperture.

6. A refractive projection objective according to claim 1, wherein only lenses of one material are used.

7. A refractive projection objective according to claim 1, wherein the ratio of constructional length (OO') and focal length of the fifth lens group is greater than eight.

8. A refractive projection objective according to claim 1, wherein the first lens group contains at least one aspheric surface.

9. A refractive projection objective according to claim 8, wherein the first lens group contains two aspheric surfaces on lens surfaces turned toward the object plane.

10. A refractive projection objective according to claim 8, wherein aspheric surfaces situated in the first lens group are situated on converging lens surfaces turned toward the object plane.

11. A refractive projection objective according to claim 1, wherein, when aspheric surfaces are used in the third lens group, these are always used on surfaces turned toward the image plane of the projection objective.

12. A refractive projection objective according to claim 1, wherein no aspheric surfaces are provided in the third lens group.

13. A refractive projection objective according to claim 1, wherein in the first lens group at least one meniscus lens, convex toward the object plane and with negative refractive power, is arranged.

14. A refractive projection objective according to claim 1, wherein the fifth lens group contains at least two aspheric surfaces.

15. A refractive projection objective according to claim 1, wherein the fifth lens group contains at least two biconvex lenses and two converging meniscuses, concave toward the image.

16. A refractive projection objective according to claim 1, wherein the fifth lens group has a maximum of 5 converging lenses.

17. A refractive projection objective according to claim 1, wherein, in the first and second lens groups, a height of a principal ray for an outermost field point is greater than a height of a marginal ray for imaging an axis point, this ratio being reversed within the third lens group.

18. A refractive projection objective according to claim 1, wherein a maximum height of a marginal ray for imaging the axis point is more than three times as large as its height in the narrowest constriction in the third lens group.

19. A refractive projection objective according to claim 1, wherein the maximum diameter of the second lens group is twice as large as the object field diameter.

20. A refractive projection objective according to claim 1, wherein the minimum free diameter in the third lens group is smaller than 1.2 times the object field diameter.

21. A projection objective for microlithography including a projection objective according to claim 1.

22. A refractive projection objective according to claim 1, comprising a plurality of refractive elements, with a plurality of light rays incident at incident angles to each refractive element and exiting at exit angles, where at each refractive element a maximum incident angle and a maximum exit angle exists, wherein at least one refractive element which is separated from an image plane of the projection objective by at least one refractive elements, has a maximum incident angle or maximum exit angle in excess of 60 degrees measured in the optically thin medium surrounding said refractive element.

23. A refractive projection objective according to claim 22, wherein at least one refractive element which is separated from an image plane of the projection objective by two to four refractive elements, has a maximum incident angle or maximum exit angle in excess of 60 degrees measured in the optically thin medium surrounding said refractive element.

24. A refractive projection objective according to claim 22, wherein at least one refractive element has a maximum exit angle in excess of 60 degrees.

25. A refractive projection objective according to claim 24, wherein the refractive element having a maximum exit angle in excess of 60 degrees is a meniscus lens with an image side concave surface.

26. A refractive projection objective according to claim 22, wherein at least one of four refractive elements situated next to a system diaphragm of said objective has a maximum incident angle or a maximum exit angle in excess of 60 degrees.

27. A refractive projection objective according to claim 26, wherein said at least one of said four refractive elements situated next to a system diaphragm is a meniscus lens.

28. A refractive projection objective according to claim 22, wherein at least one refractive element situated between an object plane and a system diaphragm of said projection objective has a maximum incident angle or a maximum exit angle in excess of 60 degrees.

29. A refractive projection objective according to claim 28, wherein said at least one refractive element is situated as one of four refractive elements next to the waist.

30. A refractive projection objective according to claim 22, wherein at least one refractive element has a maximum incident angle or a maximum exit angle in the range of 50 degrees to 60 degrees and is situated as one of four refractive elements next to a system diaphragm.

31. A refractive projection objective according to claim 22, wherein at least one refractive element bears an antireflective coating of radially varying incident or exit angle specific properties.

32. A refractive projection objective according to claim 31, wherein said refractive element is one having a maximum incident angle or a maximum exit angle in excess of 50 degrees.

33. A refractive projection objective according to claim 31, wherein said refractive element is one having a maximum incident angle or a maximum exit angle in excess of 60 degrees.

34. A method for the production of microstructured components, comprising:
providing a substrate with a photosensitive layer; and
exposing the substrate with ultraviolet light utilizing a mask and a projection exposure device having a projection objective according to claim 26,
whereby the substrate is structured in accordance with a pattern contained on the mask.

35. The method according to claim 34, further comprising developing the photosensitive layer subsequent to said exposing, for structuring the substrate in accordance with the pattern contained on the mask.

36. A refractive projection objective according to claim 1, wherein the meniscus lens immediately before the diaphragm has positive refractive power and the meniscus lens immediately after the diaphragm has negative refractive power and wherein concave surfaces of the meniscus lenses are facing towards an image plane of the projection objective.

37. A refractive projection objective according to claim 1, wherein the fourth lens group includes at least one negative lens having an image-side concave surface.

38. A refractive projection objective according to claim 1, wherein the fourth lens group includes at least one plano-concave lens having an object-side plane surface and an image-side concave surface.

39. A refractive projection objective according to claim 1, wherein the fourth lens group includes at least one negative meniscus lens having an image-side concave surface.

40. A refractive projection objective according to claim 1, wherein the fourth lens group includes two meniscus lenses each having an image-side concave surface.

41. A refractive projection objective according to claim 1, wherein two diverging meniscus lenses having convex surfaces facing the object plane are arranged in the first lens group.

42. A refractive projection objective according to claim 1, wherein at least three converging meniscus lenses and a biconvex positive lens are arranged in the second lens group, wherein at least one of the meniscus lenses has an object-side concave surface and at least one meniscus lens has an image-side concave surface.

43. A refractive projection objective according to claim 1, wherein the forth lens group has a first surface facing the object plane and a last surface facing the image plane and wherein the first surface and the last surface are aspheric surfaces.

44. A refractive projection objective according to claim 1, wherein a concave aspheric surface is arranged immediately before the system diaphragm.

45. A refractive projection objective according to claim 1, wherein the forth lens group has no more than four lenses.

46. A refractive projection objective according to claim 1, wherein an aspheric surface is arranged on an image-side lens surface and another aspheric surface is arranged on an object-side surface of a lens in the fifth lens group.

47. A refractive projection objective according to claim 1, wherein all aspheric surfaces arranged in the fifth lens group are arranged on an image-side lens surface of a lens with positive refractive power.

48. A refractive projection objective according to claim 1, wherein the fifth lens group includes at least two consecutive converging meniscus lenses and wherein aspheric surfaces are arranged on these meniscus lenses.

49. A refractive projection objective according to claim 1, wherein the fifth lens group has no more than one diverging lens.

50. A method for the production of microstructured components, comprising:
providing a substrate with a photosensitive layer; and
exposing the substrate with ultraviolet light utilizing a mask and a projection exposure device having a refractive projection objective according to claim 1,
whereby the substrate is structured in accordance with a pattern contained on the mask.

51. The method according to claim 50, further comprising developing the photosensitive layer subsequent to said exposing, for structuring the substrate in accordance with the pattern contained on the mask.

52. A refractive projection objective which, in the direction of propagation of the light, consists of a first lens group with negative refractive power, a second lens group with positive refractive power, a third lens group with negative refractive power, for the provision of a constriction of the light beam, a following fourth lens group with positive refractive power, and a system diaphragm with a following fifth lens group, which has positive refractive power,
wherein before the diaphragm and after the diaphragm a respective meniscus lens curved toward the object is arranged, and
wherein the fourth lens group includes at least one negative lens having an image-side concave surface.

53. A refractive projection objective which, in the direction of propagation of the light, consists of a first lens group with negative refractive power, a second lens group with positive refractive power, a third lens group with negative refractive power, for the provision of a constriction of the light beam, a following fourth lens group with positive refractive power, and a system diaphragm with a following fifth lens group, which has positive refractive power,
wherein before the diaphragm and after the diaphragm a respective meniscus lens curved toward the object is arranged, and,
wherein the fourth lens group includes at least one plano-concave lens having an object-side plane surface and an image-side concave surface.

54. A refractive projection objective which, in the direction of propagation of the light, consists of a first lens group with negative refractive power, a second lens group with positive refractive power, a third lens group with negative refractive power, for the provision of a constriction of the light beam, a following fourth lens group with positive refractive power, and a system diaphragm with a following fifth lens group, which has positive refractive power,
wherein before the diaphragm and after the diaphragm a respective meniscus lens curved toward the object is arranged, and,
wherein the fourth lens group includes at least one negative meniscus lens having an image-side concave surface.

55. A refractive projection objective according to claim 54, wherein the fourth lens group includes two meniscus lenses each having an image-side concave surface.

56. A refractive projection objective for projecting a pattern arranged in an object plane of the projection objective into an image plane of the projection objective with the aid of ultraviolet light of a prescribed operating wavelength at an image side numerical aperture NA>0.7 comprising:
- a first lens group immediately following the object plane and having negative refractive power;
- a second lens group immediately following the first lens group and having positive refractive power;
- a third lens group immediately following the second lens group and having negative refractive power for generating a waist;
- a fourth lens group immediately following the third lens group and having positive refractive power;
- a fifth lens group immediately following the fourth lens group and having positive refractive power; and
- a system diaphragm arranged between the fourth and the fifth lens group at a distance in front of the image plane;
- wherein a meniscus lens curved toward the object plane is arranged immediately before the system diaphragm and a meniscus lens curved toward the object plane is arranged immediately after the system diaphragm;
- wherein a negative group having an effective curvature with a concave side directed towards the image plane is arranged in a region of divergent radiation between the waist and the system diaphragm, and
- wherein the negative group comprises exactly two lenses with negative refractive power and concave surfaces each directed towards the image.

57. A refractive projection objective for projecting a pattern arranged in an object plane of the projection objective into an image plane of the projection objective with the aid of ultraviolet light of a prescribed operating wavelength at an image side numerical aperture NA>0.7 comprising:
- a first lens group immediately following the object plane and having negative refractive power;
- a second lens group immediately following the first lens group and having positive refractive power;
- a third lens group immediately following the second lens group and having negative refractive power for generating a place of narrowest constriction of a light beam passing through the projection objective;
- a fourth lens group immediately following the third lens group and having positive refractive power;
- a fifth lens group immediately following the fourth lens group and having positive refractive power; and
- a system diaphragm arranged between the fourth and the fifth lens group at a distance in front of the image plane;
- wherein two meniscus lenses with convex surfaces turned toward each other are arranged after the place of narrowest constriction and before the system diaphragm;
- wherein a negative group having an effective curvature with a concave side directed towards the image plane is arranged in a region of divergent radiation between the place of narrowest constriction and the system diaphragm, and
- wherein the negative group comprises exactly two lenses with negative refractive power and concave surfaces each directed towards the image.

* * * * *

UNITED STATES PATENT AND TRADEMARK OFFICE
CERTIFICATE OF CORRECTION

| | | |
|---|---|---|
| PATENT NO. | : 7,190,527 B2 | |
| APPLICATION NO. | : 10/931051 | |
| DATED | : March 13, 2007 | |
| INVENTOR(S) | : Hans-Juergen Rostalski et al. | |

It is certified that error appears in the above-identified patent and that said Letters Patent is hereby corrected as shown below:

Column 45, line 14, through column 45, line 22, cancel the text and insert the following claim:

--3. A refractive projection objective according to claim 2, wherein the following relationship holds:

$LD_{max}/(NA2yb) < 12,850$, where L is the constructional length measured from the object plane to the image plane of the projection objective, NA is the image-side numerical aperture, $D_{MAX}$ is the maximum diameter of the system and thus is D1 or D2, and 2yb is the diameter of the image field.--

Column 46 line 17 through column 46, line 27, cancel the text and insert the following claim:

--22. A refractive projection objective according to claim 1, comprising a plurality of refractive elements, with a plurality of light rays incident at incident angles to each refractive element and exiting at exit angles, where at each refractive element a maximum incident angle and a maximum exit angle exists, wherein at least one refractive element which is separated from an image plane of the projection objective by at least one refractive element, has a maximum incident angle or maximum exit angle in excess of 60 degrees measured in the optically thin medium surrounding said refractive element.--

Column 47 line 9 through column 47, line 16, cancel the text and insert the following claim:

--34. A method for the production of microstructured components, comprising:
providing a substrate with a photosensitive layer; and
exposing the substrate with ultraviolet light utilizing a mask and a projection exposure device having a projection objective according to claim 22,
whereby the substrate is structured in accordance with a pattern contained on the mask.--

Signed and Sealed this
Fourth Day of January, 2011

David J. Kappos
*Director of the United States Patent and Trademark Office*

Column 47 line 62 through column 47, line 63, cancel the text and insert the following claim:

--45. A refractive projection objective according to claim 1, wherein the fourth lens group has no more than four lenses.--